(12) United States Patent
Kim et al.

(10) Patent No.: US 10,360,854 B2
(45) Date of Patent: Jul. 23, 2019

(54) GATE DRIVING CIRCUIT HAVING A COMPENSATING AUXILIARY LOAD AND DISPLAY DEVICE USING THE SAME

(71) Applicant: LG Display Co., Ltd., Seoul (KR)

(72) Inventors: Jiyun Kim, Seoul (KR); ChangJae Jang, Paju-si (KR); Kyungah Chin, Paju-si (KR); JinHwan Kim, Paju-si (KR); Jongchan Park, Paju-si (KR); Hyunchul Um, Paju-si (KR); Eunkyung Seong, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 15/818,358

(22) Filed: Nov. 20, 2017

(65) Prior Publication Data

US 2018/0366066 A1 Dec. 20, 2018

(30) Foreign Application Priority Data

Jun. 14, 2017 (KR) .......................... 10-2017-0075045
Jul. 27, 2017 (KR) .......................... 10-2017-0095523
Oct. 30, 2017 (KR) .......................... 10-2017-0142529

(51) Int. Cl.
*G09G 3/3266* (2016.01)
*H01L 27/32* (2006.01)
*G09G 3/3225* (2016.01)
*G09G 3/36* (2006.01)
*H01L 27/12* (2006.01)

(52) U.S. Cl.
CPC ......... *G09G 3/3266* (2013.01); *G09G 3/3225* (2013.01); *G09G 3/3677* (2013.01); *H01L 27/3265* (2013.01); *H01L 27/3276* (2013.01); *G09G 2300/0426* (2013.01); *G09G 2300/0842* (2013.01); *G09G 2310/08* (2013.01); *G09G 2320/0223* (2013.01); *G09G 2320/0233* (2013.01); *G09G 2354/00* (2013.01); *H01L 27/124* (2013.01); *H01L 27/1255* (2013.01)

(58) Field of Classification Search
CPC ..................................................... G09G 3/3266
USPC ......................................................... 345/691
See application file for complete search history.

(56) References Cited

U.S. PATENT DOCUMENTS

2016/0224175 A1* 8/2016 Moon .................... G06F 3/0412
2017/0352311 A1* 12/2017 Lee ....................... G09G 3/3225
2018/0190946 A1* 7/2018 Li ........................... H01L 51/56
2018/0342194 A1* 11/2018 Li ......................... G09G 3/2092

* cited by examiner

*Primary Examiner* — Long D Pham
(74) *Attorney, Agent, or Firm* — Fenwick & West LLP

(57) ABSTRACT

A display device according to an embodiment of the present disclosure comprises a display panel including a display area having a plurality of pixels connected to a plurality of gate lines, a gate driving circuit in a non-display area adjacent to the display area and including a plurality of stages supplying a gate signal to the plurality of gate lines, and an auxiliary load connected to at least one stage of the plurality of stages in the non-display area in which a number of the plurality of pixels which are connected to at least two gate lines among the plurality of gate lines varies. Therefore, the load applied to the output node of the gate driving circuit is uniformly adjusted so that a screen abnormality of the display device may be suppressed.

19 Claims, 18 Drawing Sheets

GATE DRIVING CIRCUIT HAVING A COMPENSATING AUXILIARY LOAD AND DISPLAY DEVICE USING THE SAME

CROSS-REFERENCE TO RELATED APPLICATIONS

This application claims the priority of Republic of Korea Patent Application No. 10-2017-0075045 filed on Jun. 14, 2017, the priority of Republic of Korea Patent Application No. 10-2017-0095523 filed on Jul. 27, 2017, and the priority of Republic of Korea Patent Application No. 10-2017-0142529 filed on Oct. 30, 2017, in the Korean Intellectual Property Office, all of which are hereby incorporated by reference as if fully set forth herein.

BACKGROUND

The present disclosure relates to a gate driving circuit and a display device using the same, and more in detail, to a gate driving circuit which suppresses a screen abnormality of a display device due to imbalance of loads connected to a gate driving circuit and a display device using the same.

DESCRIPTION OF THE RELATED ART

Currently, various display devices have been developed and come into the market. For example, there are various display devices such as a liquid crystal display (LCD) device, a field emission display (FED) device, an electro phoretic display (EPD) device, an electro-wetting display (EWD) device, an organic light emitting display (OLED) device, and a quantum dot (QD) display device.

As technologies for implementing display devices are developed, many products are produced. Therefore, the display device may be developed for a technology of implementing a design desired by a consumer over a technology for implementing a display device. One of the technologies for implementing a design desired by the consumer is diversity of shape of a display area. The display area is an area in which a pixel emits light to display an image so that various shapes are desired in addition to a quadrangular shape. For example, providing flexibility of a product design by diversifying the shape of the display area of the display device has various purposes such as a wearable display device.

SUMMARY

A display device includes a display panel which is divided into a display area where pixels emit light to display an image and a non-display area where an image is not displayed. In the non-display area, circuits for transmitting a driving signal to a pixel array which configures the display area are disposed. A gate driving circuit is disposed to transmit a gate signal to a gate line of a pixel array and a data driving circuit is disposed to transmit a data signal to a data line of a pixel array.

The gate driving circuit mounted in the display panel is known as a gate driver in panel type circuit, that is, a GIP circuit. The GIP circuit includes a shift register and stages which configure the shift register generate outputs in response to a start pulse and shift the outputs according to a clock signal. That is, the gate driving circuit includes stages including a plurality of thin film transistors (TFTs) and stages are connected in a cascade manner to sequentially generate outputs. Hereinafter, the thin film transistor is one type of transistor and may be mentioned as a transistor.

The transistor includes an N type transistor and a P type transistor. For example, when the transistor is a P type transistor, the stages may include a Q node for controlling a pull-up transistor and a QB (Q bar) node for controlling a pull-down transistor, respectively. Further, the stages may include switching transistors which charge and discharge voltages of the Q node and the QB node to be opposite to each other in response to the start voltage signal input from a previous stage and a reset signal and a clock signal input from a subsequent stage. The reset signal may be omitted.

The QB node is charged and discharged to be opposite to the Q node. For example, when the Q node has a logic high voltage, the QB node has a logic low voltage and when the Q node has a logic low voltage, the QB node has a logic high voltage. When the logic low voltage is applied to the Q node or the QB node, the pull-up transistor or the pull-down transistor is turned on and when the logic high voltage is applied to the Q node or the QB node, the pull-up transistor or the pull-down transistor is turned off. By doing this, the gate signal which is applied to the pixel array may turn-on/turn-off a transistor included in the pixel array. One electrode of the pull-up transistor and the pull-down transistor is connected to a gate line for supplying the gate signal to the pixel array so that the pull-up transistor and the pull-down transistor is affected by a load formed by the pixel array.

When the shape of the display area is diversified, the load applied to each of the plurality of gate lines is not uniform. For example, an error of a gate signal applied to the pixel array is incurred due to a change in the load, which causes a problem such as a screen abnormality or degradation of an image quality of the screen.

Therefore, according to one or more embodiments of the present disclosure, a gate driving circuit which reduces a difference between loads applied to each stage of the gate driving circuit and a display device to which the gate driving circuit may be applied.

Embodiments relate to providing a display device which improves an abnormal driving phenomenon due to imbalance of loads applied to stages of a gate driving circuit and provides a uniform output characteristic.

Embodiments relate to a display device that includes a display panel including a display area having a plurality of pixels connected to a plurality of gate lines, a gate driving circuit in a non-display area adjacent to the display area including a plurality of stages supplying a gate signal to the plurality of gate lines, and an auxiliary load connected to at least one stage of the plurality of stages in the non-display area. A number of the plurality of pixels which are connected to at least two gate lines among the plurality of gate lines varies. Therefore, it is possible to implement the display device which suppresses an abnormal driving phenomenon due to imbalance of the load applied to each stage of the gate driving circuit and provides a uniform output characteristic.

According to another aspect of the present disclosure, there is provided a display device. The display device comprises a display panel including a display area having a normal structure area and a heterogeneous structure area and a non-display area adjacent to the display area. The display panel includes gate lines, a plurality of pixels connected to the gate lines, a gate driving circuit having stages supplying a gate signal to the gate lines in the non-display area, and a dummy load connected to stages connected to the plurality of pixels in the heterogeneous structure area, the dummy load being in the non-display area. Therefore, it is possible to implement the display device which suppresses an abnormal driving phenomenon due to imbalance of the load applied to each stage of the gate driving circuit and provides a uniform output characteristic.

Embodiments also relate to a display device comprising a display area including a pixel array having a plurality of pixels connected to a plurality of gate lines, a non-display area being adjacent to the display area, the non-display area having a gate driving circuit, and a dummy load connected to an output node of the gate driving circuit to improve an erroneous output phenomenon of the gate driving circuit due to a load imbalance of the display area. Therefore, it is possible to implement the display device which suppresses an abnormal driving phenomenon due to imbalance of the load applied to the gate driving circuit and provides a uniform output characteristic.

According to one or more embodiments of the present disclosure, when a pixel load applied to a stage is reduced, an auxiliary load is disposed in an output node of the stage to increase a load applied to the output node so that an abnormal driving phenomenon caused by reduction of the load may be suppressed.

And, according to one or more embodiments of the present disclosure, an auxiliary load connected to an output node of an emission stage with a reduced pixel load is disposed in a non-display area so as to provide a gate turn-on voltage to a gate electrode of a pixel array during an emission period.

And, according to one or more embodiments of the present disclosure, an auxiliary load connected to an output node of a scan stage with a reduced pixel load is disposed in a non-display area, to suppress delay of a compensation time, thereby ensuring a reliability of a driving transistor.

And, according to one or more embodiments of the present disclosure, a dummy load is connected to the stages disposed in a heterogeneous structure area and the dummy load is located according to a shape of the heterogeneous structure so that an abnormal driving phenomenon which may be caused due to the reduction of the load applied to the stages in the heterogeneous structure area may be suppressed.

And, according to one or more embodiments of the present disclosure, a dummy load is disposed in an output node of a stage disposed in a heterogeneous structure area and a pixel connected to the stage disposed in the heterogeneous structure area so that an abnormal driving phenomenon which may be caused due to the reduction of the load applied to the stages in the heterogeneous structure area may be suppressed.

And, according to one or more embodiments of the present disclosure, a size of an active layer of any one of a first transistor and a second transistor which configure stages disposed in a heterogeneous structure area is smaller than a size of an active layer of any one of a first transistor and a second transistor which configure stages disposed in a normal structure area so that a size of a dummy load connected to the stages disposed in the heterogeneous structure area is reduced to implement a narrow bezel display device and suppress non-uniformity of a luminance due to a deviation of the loads.

And, according to one or more embodiments of the present disclosure, an auxiliary resistor and an auxiliary capacitor of an auxiliary load are formed of the same material on the same layer as a transistor and routing lines so that the auxiliary load may be formed without performing an additional process, thereby suppressing abnormal driving phenomenon of the display device.

And, according to one or more embodiments of the present disclosure, an auxiliary capacitor is formed using three electrodes so that a capacitance is improved as compared with an auxiliary capacitor formed using two electrodes so that a capacitance of the auxiliary capacitor according to a pixel load may be effectively adjusted.

And, according to one or more embodiments of the present disclosure, when the auxiliary load is insufficient due to an insufficient space, a size of a buffer transistor disposed in a heterogeneous structure area is made to be smaller than a size of a buffer transistor disposed in a normal structure area, thereby suppressing non-uniformity of a luminance due to a deviation of the load.

The objects to be achieved by the present disclosure, the means for achieving the objects, and effects of the present disclosure described above do not specify essential features of the claims, and, thus, the scope of the claims is not limited to the disclosure of the present disclosure.

BRIEF DESCRIPTION OF THE DRAWINGS

The above and other aspects, features and other advantages of the present disclosure will be more clearly understood from the following detailed description taken in conjunction with the accompanying drawings.

FIG. 16 is a graph illustrating a current level of an organic light emitting element for each area in a display device to which FIG. 5 is applied.

FIG. 17 is a graph illustrating a current level of an organic light emitting element for each area in a display device to which FIG. 7, 9, or 11 is applied.

DETAILED DESCRIPTION OF THE EMBODIMENT

Figure 1:
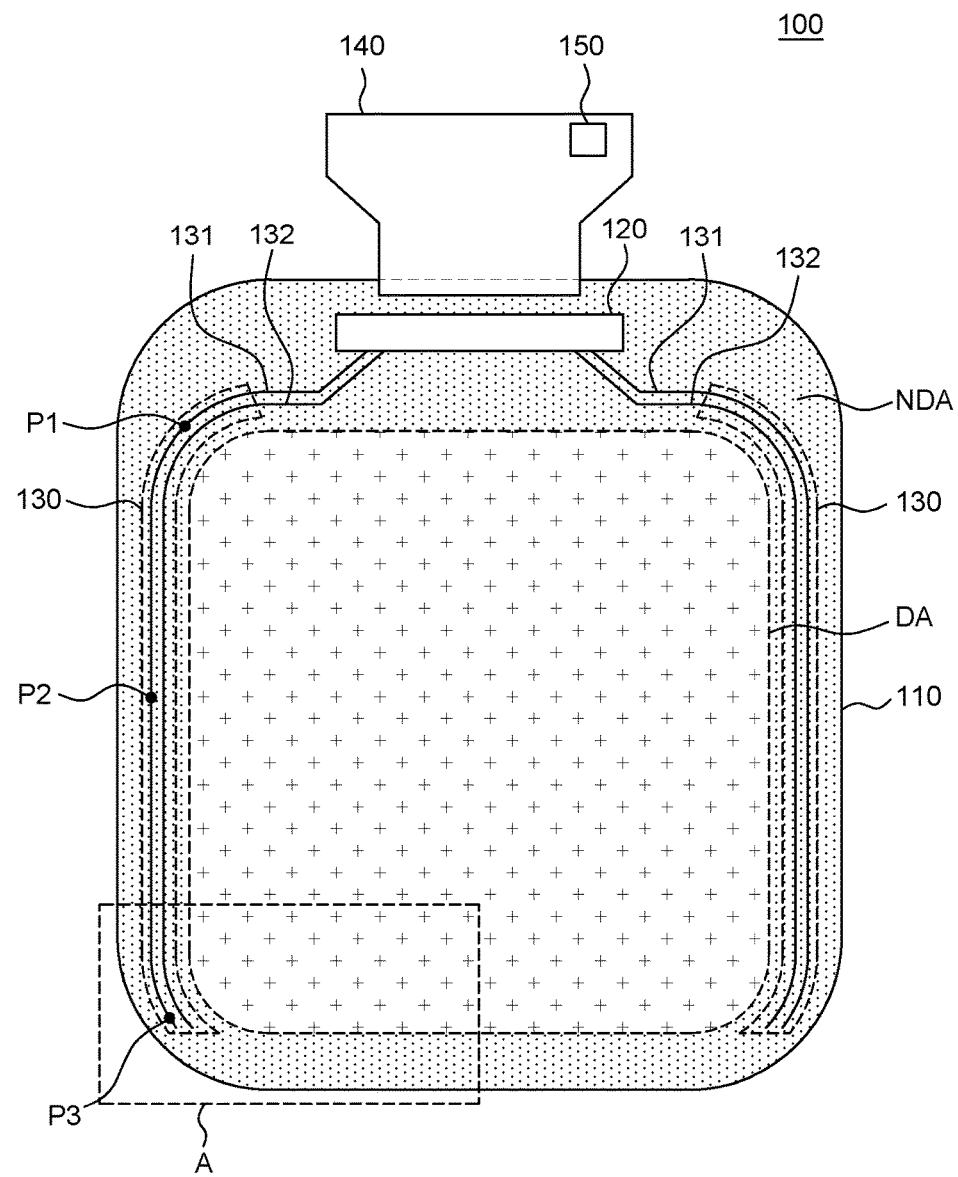
FIG. 1 is a view illustrating a display device according to an embodiment of the present disclosure.

Advantages and characteristics of the present disclosure and a method of achieving the advantages and characteristics will be clear by referring to exemplary embodiments described below in detail together with the accompanying drawings. However, the present disclosure is not limited to exemplary embodiment disclosed herein but will be implemented in various forms. The exemplary embodiments are provided by way of example only so that a person of ordinary skilled in the art can fully understand the disclosures of the present disclosure and the scope of the present disclosure. Therefore, the present disclosure will be defined only by the scope of the appended claims.

The shapes, sizes, ratios, angles, numbers, and the like illustrated in the accompanying drawings for describing the exemplary embodiments of the present disclosure are merely examples, and the present disclosure is not limited thereto. Like reference numerals generally denote like elements throughout the specification. Further, in the following description of the present disclosure, a detailed explanation of known related technologies may be omitted to avoid unnecessarily obscuring the subject matter of the present disclosure. The terms such as "including," "having," and "comprising" used herein are generally intended to allow other components to be added unless the terms are used with the term "only". Any references to singular may include plural unless expressly stated otherwise.

Components are interpreted to include an ordinary error range even if not expressly stated.

When the position relation between two parts is described using the terms such as "on", "above", "below", and "next", one or more parts may be positioned between the two parts unless the terms are used with the term "immediately" or "directly" is not used.

When the relation of a time sequential order is described using the terms such as "after", "continuously to", "next to", and "before", the order may not be continuous unless the terms are used with the term "immediately" or "directly".

Although the terms "first", "second", and the like are used for describing various components, these components are not confined by these terms. These terms are merely used for distinguishing one component from the other components. Therefore, a first component to be mentioned below may be a second component in a technical concept of the present disclosure.

The features of various embodiments of the present disclosure can be partially or entirely bonded to or combined with each other and can be interlocked and operated in technically various ways, and the embodiments can be carried out independently of or in association with each other.

Hereinafter, a gate driving circuit according to an embodiment of the present disclosure and a display device using the same will be described with reference to the accompanying drawings.

FIG. 1 is a view illustrating a display device according to an embodiment of the present disclosure. FIG. 3 is a waveform illustrating clock signals at a first point, a second point, and a third point of a clock line of FIG. 1 or 2. FIG. 1 will be described with reference to FIG. 3.

Referring to FIG. 1, a display device 100 includes a substrate 110 including a display area DA in which a plurality of pixels is disposed to display an image and a non-display area NDA in which an image is not displayed. The non-display area NDA is located in the vicinity of the display area DA or around the display area DA and a driving circuit and signal lines for transmitting a driving signal to a pixel array are disposed in the non-display area are disposed therein.

The pixel array disposed in the display area DA receives a data signal and a gate signal through a data line and a gate line, respectively to be operated. The gate driving circuit 130 may be formed in the non-display area in a GIP manner. For example, the gate driving circuit 130 may be disposed at left and right outer sides of the display area DA and any one of the gate driving circuits 130 disposed at the left and right may be omitted. The gate driving circuit 130 supplies gate signals to the gate lines using clock signals applied from a clock line 131 and a start voltage line 132. For the convenience of description, in FIG. 1, only one clock line 131 and one start voltage line 132 are illustrated, respectively.

For example, when the display device 100 includes n pixel rows, the clock line 131 extends to be connected from a first pixel row to an n-th pixel row to sequentially apply the signal from the first pixel row and the n-th pixel row. In this case, the load of the clock line 131 is increased toward the n-th pixel row and the increased load of the clock line 131 may cause delay of the clock signal.

Referring to FIGS. 1 and 3, as illustrated in FIG. 1, the clock signal may be supplied from an integrated driving circuit 120 in which functions of the data driving circuit and the timing control unit are combined. In this case, it takes longer time to change the clock signal from a gate off voltage Voff to a gate on voltage Von and to change the clock signal from the gate on voltage Von to the gate off voltage Voff as it goes from the first point P1 which is the closest to the integrated driving circuit 120 to the third point P3 which is the farthest from the integrated driving circuit 120. For example, when the pixel driving circuit which is disposed in the pixel array to drive a pixel is formed by a plurality of P type transistors, the gate on voltage Von is a gate low voltage and the gate off voltage Voff is a gate high voltage. That is, the gate driving circuit 130 may be erroneously driven due to the delay of the clock signal caused by the load of the clock line 131 or a luminance uniformity of the display device 100 may be deteriorated due to insufficient data voltage supplying period of the pixels.

The integrated driving circuit 120 is manufactured in the form of a driver IC chip to be attached on an upper portion of the substrate 110 but a position or a shape of the integrated driving circuit 120 is not limited thereto. The integrated driving circuit 120 is supplied with power voltages through a power line. The power voltages may be supplied from the power supply unit 150 outside the substrate 110. The power supply unit 150 is attached onto a flexible printed circuit board 140 attached on the substrate 110 and supplies power voltages to the driving circuit and the pixel array through the flexible printed circuit board 140.

Figure 2:
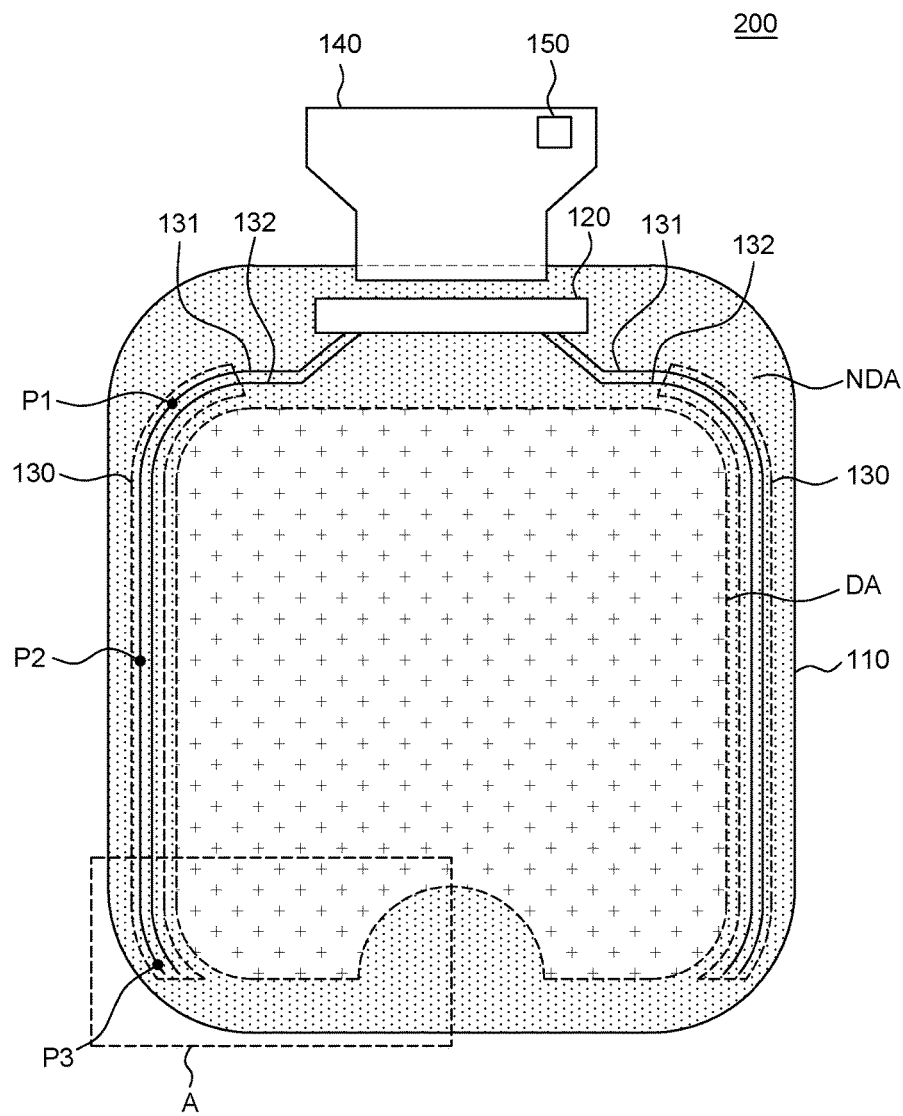
FIG. 2 is a view illustrating a display device according to another embodiment of the present disclosure.
Figure 3:
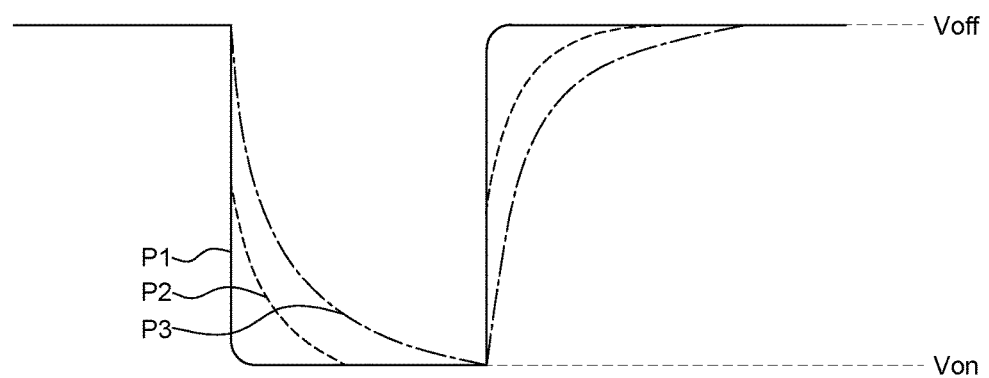
FIG. 3 is a waveform illustrating clock signals at a first point, a second point, and a third point of a clock line of FIG. 1 or 2.

FIG. 2 is a view illustrating a display device 200 according to another embodiment of the present disclosure. FIG. 2 is a modified embodiment of the embodiment illustrated in FIG. 1 and components which overlap those in FIG. 1 will be omitted or briefly described.

FIG. 2 is an embodiment in which a shape of the display area DA of the display device 100 illustrated in FIG. 1 is modified. The display area DA of FIG. 2 is formed such that a lower portion of the display area DA close to the third point P3 is inwardly concave. In the position where a boundary of the display area DA is concave, pixels are not disposed so that an image is not displayed. In this area, physical components, for example, a button, a speaker, a switch, and the like, are disposed to implement other functions of the display device 200. In FIG. 2, as a modified embodiment of a quadrangular display area DA, a part of one side of the quadrangle is inwardly concave, but is not limited thereto and may be implemented by various shapes. For example, various shapes of holes may be formed in the display area DA. Pixels are not disposed in areas in the holes so that images are not displayed. Therefore, the areas in holes may be included as the non-display area NDA. Hereinafter, a shape obtained when a polygon such as a circle, a triangle, a rectangle, a rhombus, a pentagon, or a hexagon is modified so that it is difficult to be defined as a polygon and a shape which is configured such that when a pixel is not disposed in the display area so that when an image is displayed, the area in which the pixel is not disposed is visibly recognized will be referred to as a heterogeneous structure.

Due to the heterogeneous structure, the number of pixels connected to the gate line of the third point P3 is rapidly reduced as compared with the second point P2 of the clock line 131. That is, as a load of the gate line is rapidly reduced at the third point P3, a difference of loads between gate lines is increased and the difference of loads between gate lines may affect the operation of the gate driving circuit 130. In this case, the difference of loads between gate lines may cause a delay of the gate signal which is input to the pixel driving circuit.

Referring to FIG. 3, similarly to FIG. 1, it takes longer time to change the clock signal from a gate off voltage Voff to a gate on voltage Von and to change the clock signal from the gate on voltage Von to the gate off voltage Voff as it goes from the first point P1 which is the closest to the integrated driving circuit 120 to the third point P3 which is the farthest from the integrated driving circuit 120.

Therefore, a delay of the output signal of the gate driving circuit 130 or insufficient data voltage supply period of the pixels may be caused due to a rapid reduction of the load applied to the gate line and the delay of the clock signal. Therefore, the uniformity of the luminance may be deteriorated.

Figure 4:
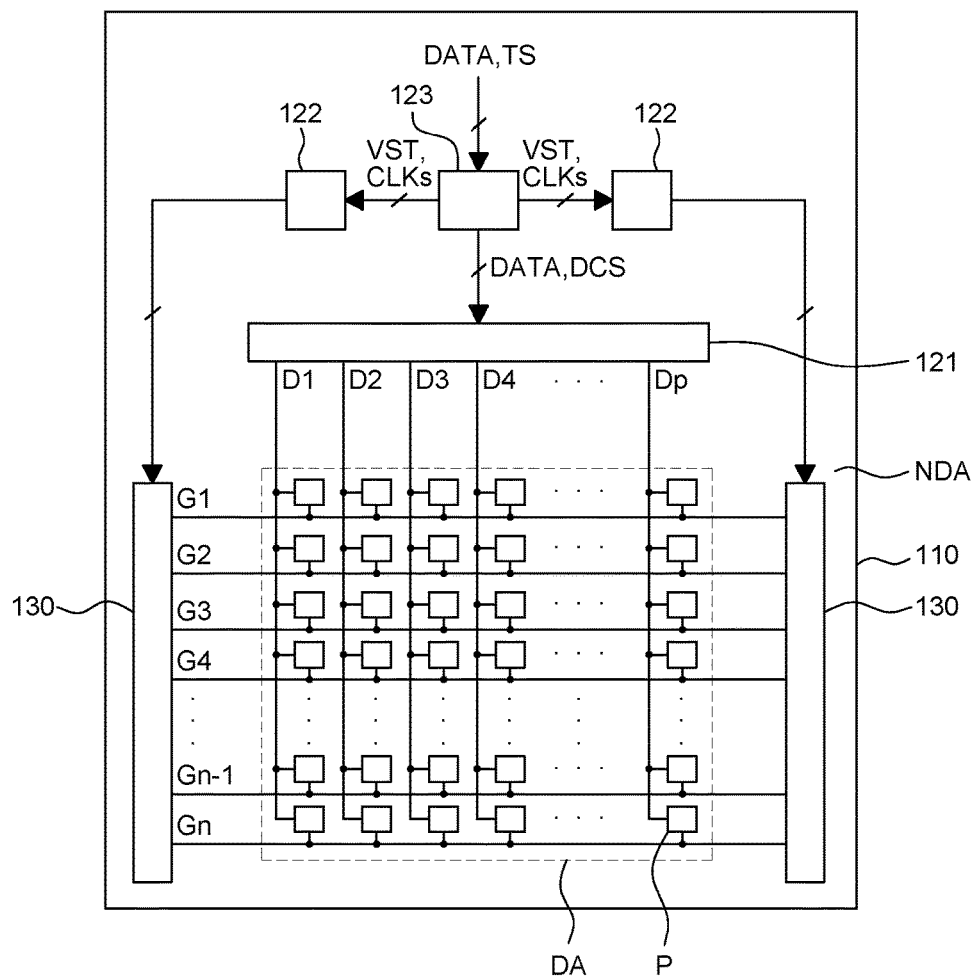
FIG. 4 is a block diagram illustrating a display panel according to an embodiment of the present disclosure.

FIG. 4 is a block diagram illustrating a display panel according to an embodiment of the present disclosure.

In the substrate 110, data lines D1 to Dp (p is a positive integer which is equal to or larger than 2) which form p columns and gate lines G1 to Gn (n is a positive integer which is equal to or larger than 2) which form n rows, and a display area DA including pixels P are formed. Each pixel P may be connected to any one of data lines D1 to Dp and any one of gate lines G1 to Gn. The pixel P is implemented by an organic light emitting element including an anode, a light emitting layer, and a cathode to emit light. The number of data lines D1 to Dp connected to each of the gate lines G1 to Gn is p, which may vary. That is, the number of pixels P which are connected to each of the gate lines G1 to Gn may vary. For example, in the embodiment of FIG. 2, the number of data lines and pixels connected to the gate line Gn in the n-th row may be smaller than p due to a rounded corner of the display area DA and the heterogeneous structure.

Even though in the embodiment of the present disclosure, the driving is performed from a point close to the integrated driving circuit, the driving may be performed from a point which is far from the integrated driving circuit. When the driving is performed from the point which is distant from the integrated driving circuit, the first gate line G1 is disposed in a point which is far from the integrated driving circuit.

The gate driving circuit 130 is connected to the gate lines G1 to Gn to supply gate signals. In detail, the gate driving circuit 130 receives a gate control signal including clock signals CLKs and a start voltage VST from a level shifter 122. The gate driving circuit 130 generates gate signals according to the clock signals CLKs and the start voltage VST to supply the gate signals to the gate lines G1 to Gn.

The level shifter 122 shifts the voltage level of the clock signals CLKs and the start voltage VST input from a timing control unit 123 to a voltage level of the gate on voltage Von and the gate off voltage Voff which may switch the transistor formed on the display panel. The level shifter 122 supplies the level-shifted clock signals CLKs to the gate driving circuit 130 through clock lines and supplies the level-shifted start voltage VST to the gate driving circuit 130 through a start voltage line. The clock lines and the start voltage line are lines through which the clock signals CLKs and the start voltage VST corresponding to the gate control signal are transmitted so that the clock lines and the start voltage line are collectively referred to as gate control lines in the present disclosure.

The data driving circuit 121 is connected to the data lines D1 to Dp. The data driving circuit 121 is supplied with digital image data DATA and a data control signal DCS from the timing controller 123. The data driving circuit 121 converts the digital image data DATA into analog data voltages according to the data control signal DCS. The data driving circuit 121 supplies the analog data voltages to the data lines D1 to Dp.

The timing control unit 123 receives digital image data DATA and timing signals TS from an external system board. The timing signals TS may include a vertical synchronization signal, a horizontal synchronization signal, and a data enable signal.

The timing control unit 123 generates a gate control signal for controlling an operating time of the gate driving circuit 130 and a data control signal DCS for controlling an operating time of the data driving circuit 121 based on the timing signals TS.

Similarly to the integrated driving circuit 120 of FIG. 1 or 2, the data driving circuit 121, the level shifter 122, and the timing control unit 123 may be formed as one driver IC. However, the embodiment of the present disclosure is not limited thereto and the data driving circuit 121, the level shifter 122, and the timing control unit 123 may be formed as separate driver ICs. And, the integrated driving circuit 120 may be attached directly onto the substrate 110 of the display panel by a chip on glass (COG) method or a chip on plastic (COP) method or attached onto the substrate 110 by a chip on film (COF) method.

The power supply unit 150 of FIG. 1 or 2 generates a plurality of power voltages required to drive pixels P such as a high potential power voltage and a low potential power voltage, gate driving voltages required to drive the gate driving circuit such as a gate on voltage Von and the gate off voltage Voff, a source driving voltage required to drive the data driving circuit 121, a driving voltage required to drive the timing control unit 123, and the like.

Figure 5:
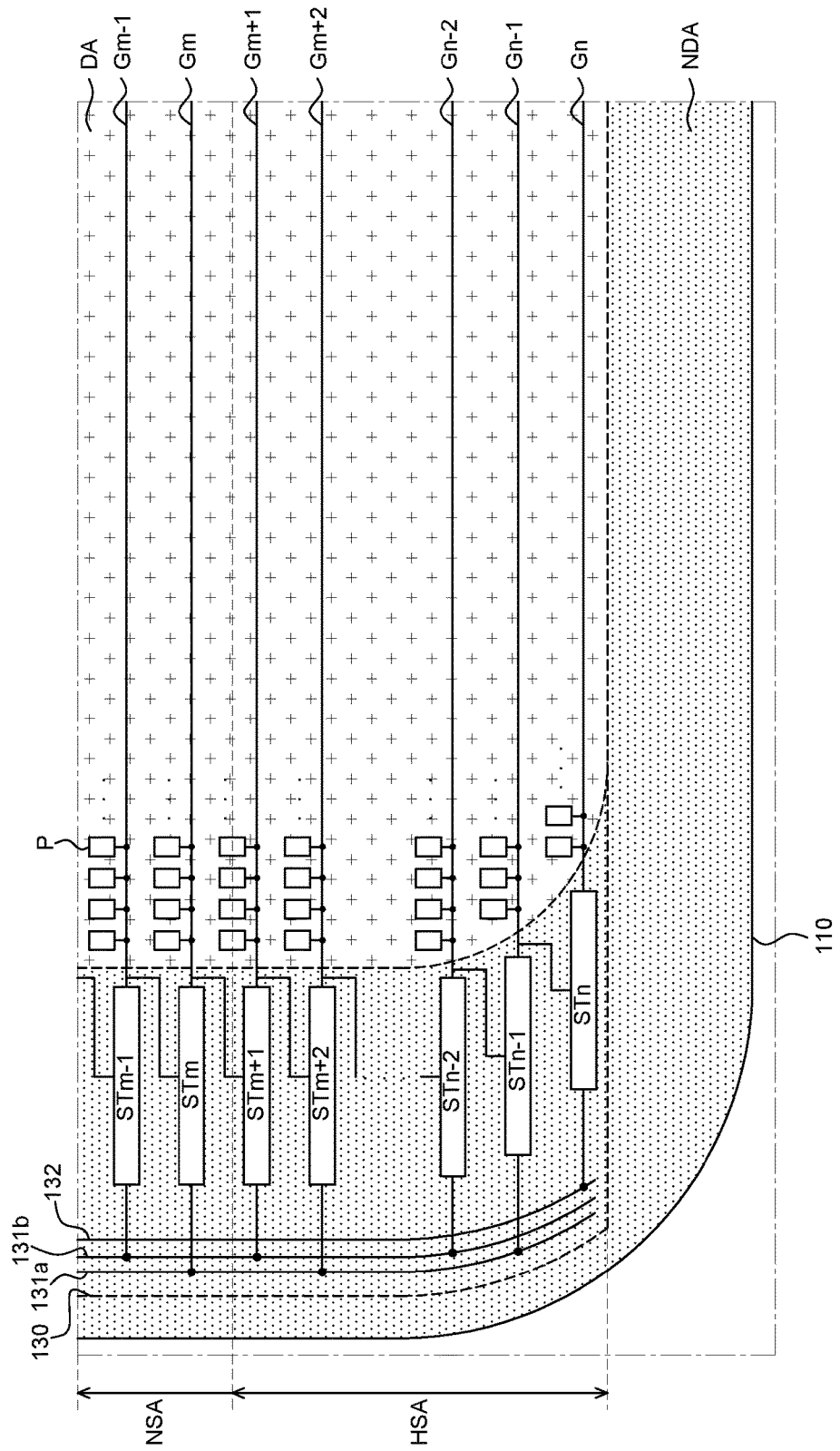
FIG. 5 is an enlarged view of portion A in FIG. 1 or 2.

FIG. 5 is an enlarged view of portion A of FIG. 1 or 2.

The gate driving circuit 130 includes n stages ST1 to STn. The portion A may include a normal structure area NSA and a heterogeneous structure area HSA. In the normal structure area, the number of pixels connected to each of the gate lines is the same. In the heterogeneous structure area, the number of pixels connected to each of the gate lines varies. And in the heterogeneous structure area, a shape of a display area DA may be different from that in the normal area. For example, the heterogeneous structure area may include a structure in which a corner of the display area DA is rounded and a lower portion of the display area DA is inwardly concave. For example, the normal structure area NSA of the portion A includes a m−1-th stage STm−1 and a m-th stage STm and the heterogeneous structure area HSA includes a total of n-m stages including a m+1-th stage STm+1 to an n-th stage Stn. Each of the stages STm−1 to STn is connected to the gate line to supply the gate signal to the plurality of pixels. The m−1-th stage STm−1 is connected to a m−1-th gate line Gm−1, the m-th stage STm is connected to a m-th gate line Gm, the m+1-th stage STm+1 is connected to a m+1-th gate line Gm+1, the m+2-th stage STm+2 is connected to a m+2-th gate line Gm+2, the n−2-th stage STn−2 is connected to a n−2-th gate line Gn−2, the n−1-th stage STn−1 is connected to a n−1-th gate line Gn−1, and the n-th stage STn is connected to a n-th gate line Gn.

The stages are alternately connected from the first clock line 131a and the second clock line 131b to be supplied with the clock signal. And, the start voltage line 132 is connected to a first stage to supply a start voltage to start the driving of the gate driving circuit 130. The number of clock lines connected to each stage and a connection method are not limited to the embodiment illustrated in FIG. 5. The number of clock lines connected to each of stages is formed to be one so that the size of the non-display area NDA may be reduced.

Referring to FIG. 5, since the corner of the substrate 110 is formed to be rounded according to the embodiment of the present disclosure so that the corner of the display area DA is also formed to be rounded. Therefore, as it is close to the n-th stage STn, stages including the n-th stage STn are disposed to be shifted to the right so as to be adjacent to the display area DA. By doing this, the stages are disposed to be closer to the display area DA as long as possible so that the load of the gate signal which is applied to the stages may be reduced.

Figure 6:
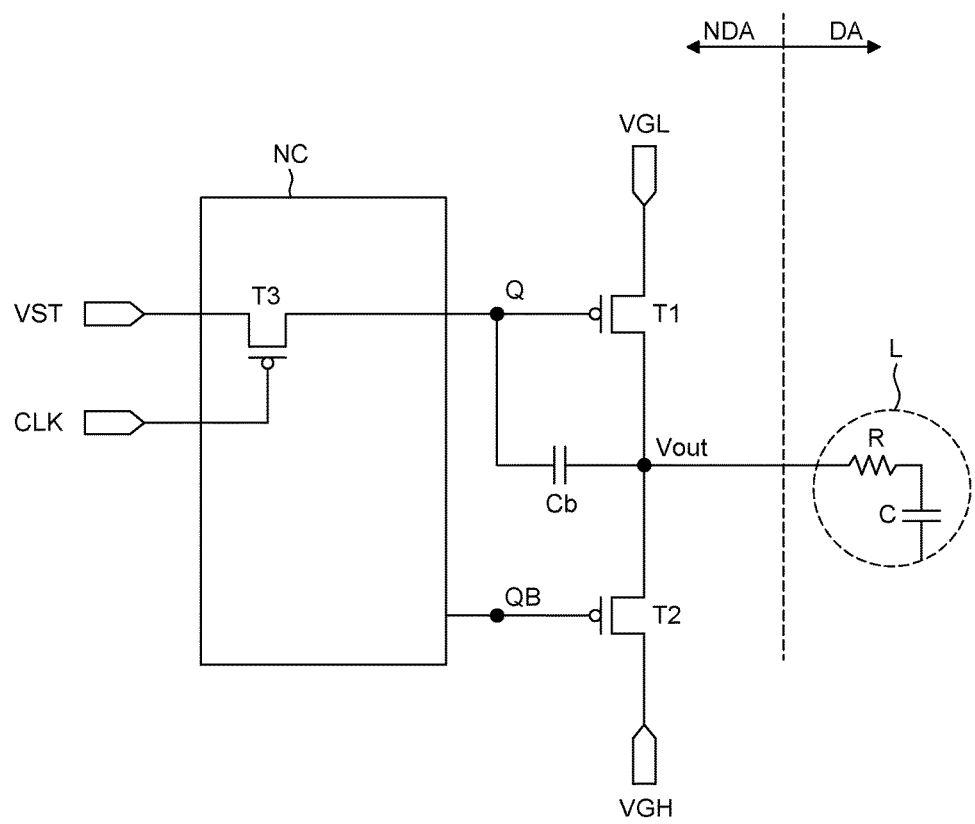
FIG. 6 is a circuit diagram illustrating each stage of FIG. 5 and a load connected to each stage.

FIG. 6 is a circuit diagram illustrating each stage of FIG. 5 and a load connected to each stage.

Stages of the gate driving circuit may include a scan stage and an emission stage. The circuit diagram illustrated in FIG. 6 is modified to be applied to both the scan stage and the emission stage.

For example, transistors which configure the stage are P type transistors. The stage includes a first transistor T1, a second transistor T2, a boosting capacitor Cb, and a node control unit NC. The first transistor T1 is a pull-up transistor. When a Q node for controlling the first transistor T1 is charged with a gate on voltage, the first transistor T1 is turned on. The second transistor T2 is a pull-down transistor. When a QB node for controlling the second transistor T2 is charged with a gate on voltage, the second transistor T2 is turned on. The first transistor T1 and the second transistor T2 share the output node Vout and are connected in series.

The node control unit NC controls charging and discharging of the Q node and the QB node. The node control unit NC may control the charging and discharging of the Q node and the QB node according to a start terminal to which the start voltage VST and an output signal of a previous stage are input and a clock terminal to which the clock signal CLK is input. For example, in order to stably control the output of the stage, when the Q node is charged with the gate on voltage, the node control unit NC discharges the QB node to a gate off voltage. When the QB node is charged with the gate on voltage, the node control unit NC discharges the Q node to a gate off voltage. The node control unit NC may further include a reset terminal to which an output signal of a subsequent stage is input in order to control the charging and discharging of the Q node and the QB node.

When the Q node is charged with the gate on voltage, the first transistor T1 is turned on to apply a gate low voltage VGL to the output node Vout. When the QB node is charged with the gate on voltage, the second transistor T2 is turned on to apply a gate high voltage VGH to the output node Vout. Since the first transistor T1 and the second transistor T2 are P type transistors, the gate on voltage is a gate low voltage VGL and the gate off voltage is a gate high voltage VGH.

The boosting capacitor Cb is disposed between the Q node and the output node Vout. When the first transistor T1 is turned on, the boosting capacitor Cb boosts the Q node so that the first transistor T1 may be stably maintained in a turned-on state. Therefore, the output voltage of the output node Vout may be stably maintained to be a gate low voltage VGL.

Referring to FIG. 1 or 2, 4, and 5, the output node Vout is connected to the gate electrode which supplies the gate signal to the pixels P of the display area DA. And, the number of pixels P connected to one stage may be p or smaller. A load applied to the output node Vout varies according to the number of pixels P connected to one stage. For example, a load applied to an output terminal of the n-th stage STn disposed in the heterogeneous structure area HSA is smaller than a load applied to an output terminal of the m-th stage STm disposed in the normal structure area NSA. This is because the number of pixels P connected to the n-th stage STn disposed in the heterogeneous structure area HSA is smaller than the number of pixels P connected to the m-th stage STm disposed in the normal structure area NSA. And, due to the heterogeneous structure, the number of pixels P connected to the n-th stage STn is significantly reduced as compared with the number of pixels P connected to the m-th stage STm. In this case, the heterogeneous structure may be provided between pixels P connected to the m+1-th stage STm+1 to the n-th stage STn.

Referring to FIG. 6, pixels connected to the output node Vout of the stage may be represented as loads and the loads may be represented as a resistor R and a capacitor C. In this case, the load may be referred to as a pixel load L. As described above, the load connected to the stages disposed in the heterogeneous structure area HSA is smaller than the load connected to the stages which are not disposed in the heterogeneous structure area HSA.

The node control unit NC may include a third transistor T3. The third transistor T3 is connected between the Q node and the start voltage VST terminal so that turn-on/turn-off of the third transistor T3 is controlled according to the clock signal CLK connected to the gate electrode of the third transistor T3. That is, the node control unit NC controls the charging and discharging of the Q node according to the clock signal CLK to control the first transistor T1 to be turn-on/turn-off.

Figure 7:
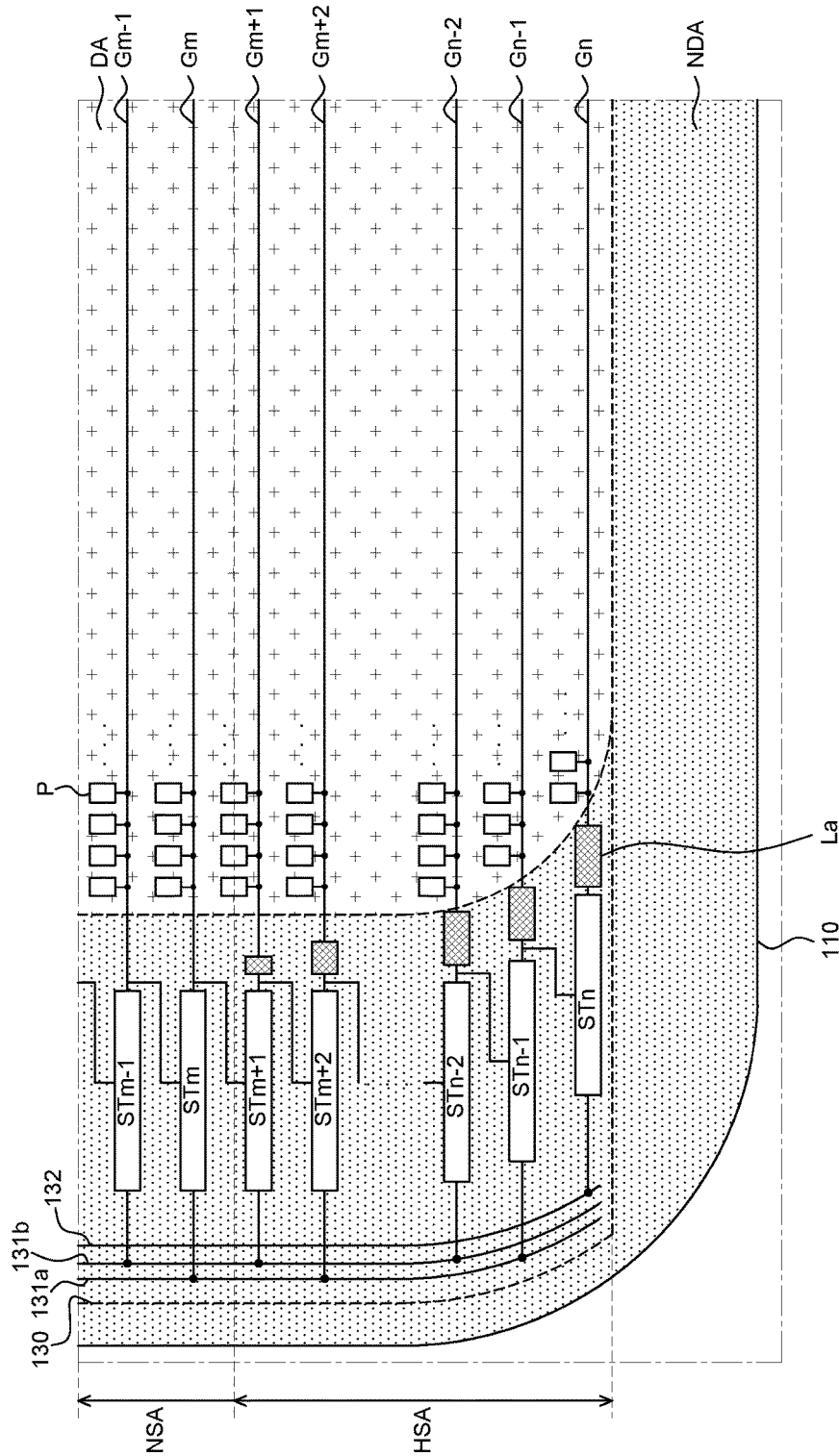
FIG. 7 is an enlarged view of portion A of FIG. 1 or 2 according to an embodiment of the present disclosure.

FIG. 7 is an enlarged view of portion A of FIG. 1 or 2 according to an embodiment of the present disclosure. FIG. 7 is a modified embodiment of the embodiment illustrated in FIG. 5 and components which overlap those in FIG. 5 will be omitted or briefly described.

As described above, the normal structure area NSA of the portion A includes a m−1-th stage STm−1 and a m-th stage STm and the heterogeneous structure area HSA includes a total of n-m stages including a m+1-th stage STm+1 to an n-th stage STn. A pixel load L due to pixels connected to each of the m+1-th stage STm+1 to the n-th stage STn may be smaller than a pixel load connected to any one of the m-th stage STm and stages previous to the m-th stage STm.

Difference of the load connected to each stage may cause abnormality of the output signal so that in order to lessen the difference of the loads, an auxiliary load La is disposed between the stages and the display area DA. In this case, the auxiliary load La may also referred to as a dummy load. In order to dispose the auxiliary load La, the gate driving circuit 130 moves to the left to ensure a space between the stages and the display area DA. The smaller the pixel load L due to the pixels P connected to the stage, the larger the auxiliary load La to be designed and disposed. For example, the auxiliary loads La connected to the stage may be increased in the order of the m+1-th stage STm+1, the m+2-th stage STm+2, the n−2-th stage STn−2, the n−1-th stage STn−1, and the n-th stage STn. Alternatively, when the difference of the pixel loads L connected to adjacent stages is not so large, the auxiliary loads La may be equal to each other. The auxiliary load La is disposed in the non-display area NDA and may be implemented as a part of the gate driving circuit 130.

That is, a dummy load is connected to the stages disposed in the heterogeneous structure area HSA and the dummy load is disposed according to a shape of the heterogeneous structure so that an abnormal driving phenomenon which may be caused due to the reduction of the load applied to the stages in the heterogeneous structure area HSA may be suppressed.

Figure 8:
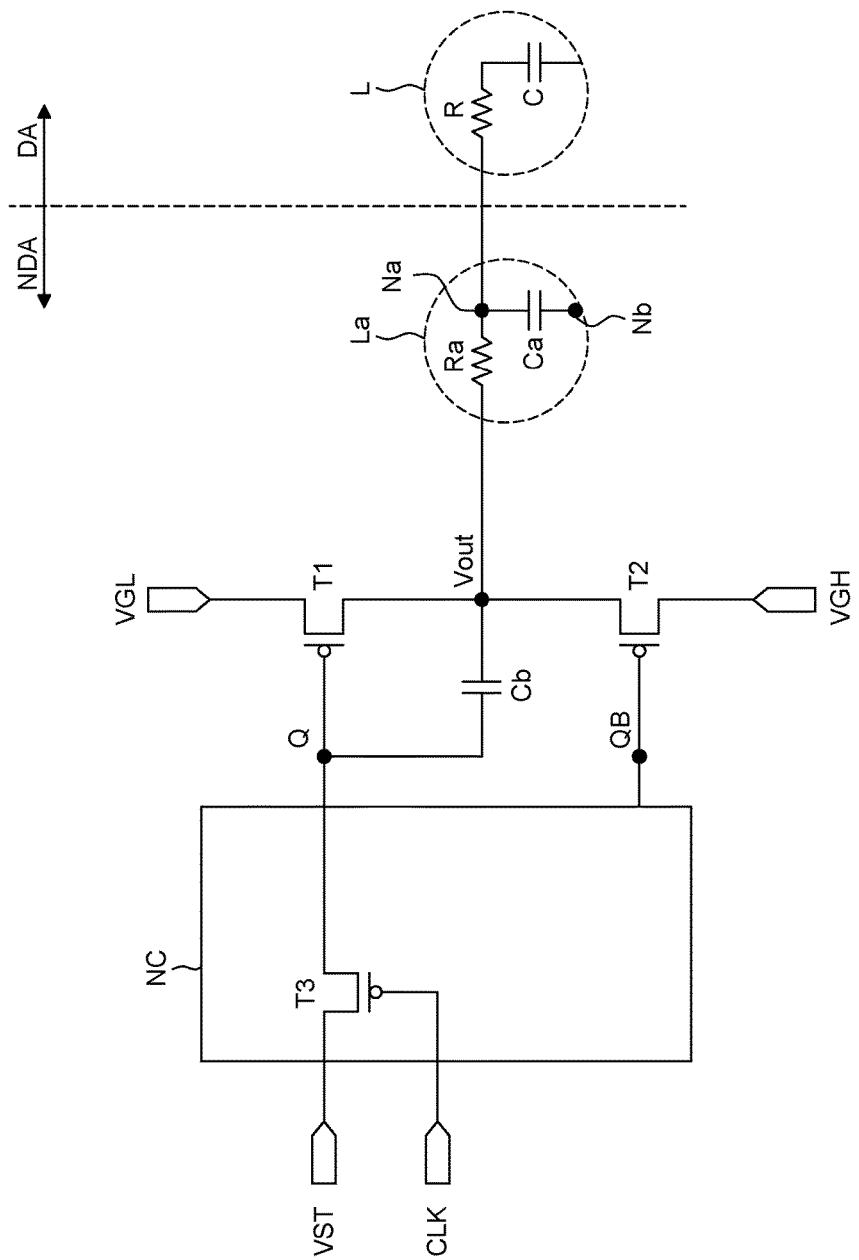
FIG. 8 is a circuit diagram illustrating each stage in a heterogeneous structure area of FIG. 7 and a load connected to each stage.

FIG. 8 is a circuit diagram illustrating each stage in a heterogeneous structure area of FIG. 7 and a load connected to each stage. FIG. 8 is a modified embodiment of the embodiment illustrated in FIG. 6 and components which overlap those in FIG. 6 will be omitted or briefly described.

As described with reference to FIG. 6, each of the stages of the gate driving circuit of FIG. 8 may include a scan stage and an emission stage. Therefore, when the circuit diagram illustrated in FIG. 8 is applied to the scan stage and the emission stage, the circuit diagram is modified to be applied to both the scan stage and the emission stage.

As an example of transistors which configure the stage, a P type transistor will be described. The stage includes a first transistor T1, a second transistor T2, a boosting capacitor Cb, and a node control unit NC. The first transistor T1 is referred to as a pull-up transistor. When a Q node for controlling the first transistor T1 is charged with a gate on voltage, the first transistor T1 is turned on. The second transistor T2 is referred to as a pull-down transistor. When a QB node for controlling the second transistor T2 is charged with a gate on voltage, the second transistor T2 is turned on. And, the node control unit NC controls charging and discharging of the Q node and the QB node.

Referring to FIGS. 7 and 8, the auxiliary load La is connected between the output node Vout and a pixel load L by the pixels P of the display area DA. The auxiliary load La may be represented as an auxiliary resistor Ra and an auxiliary capacitor Ca. The auxiliary load La is disposed so that a total loads applied to the output node Vout is increased. That is, the load applied to the output node Vout is a sum of the auxiliary load La and the pixel load L.

Figure 9:
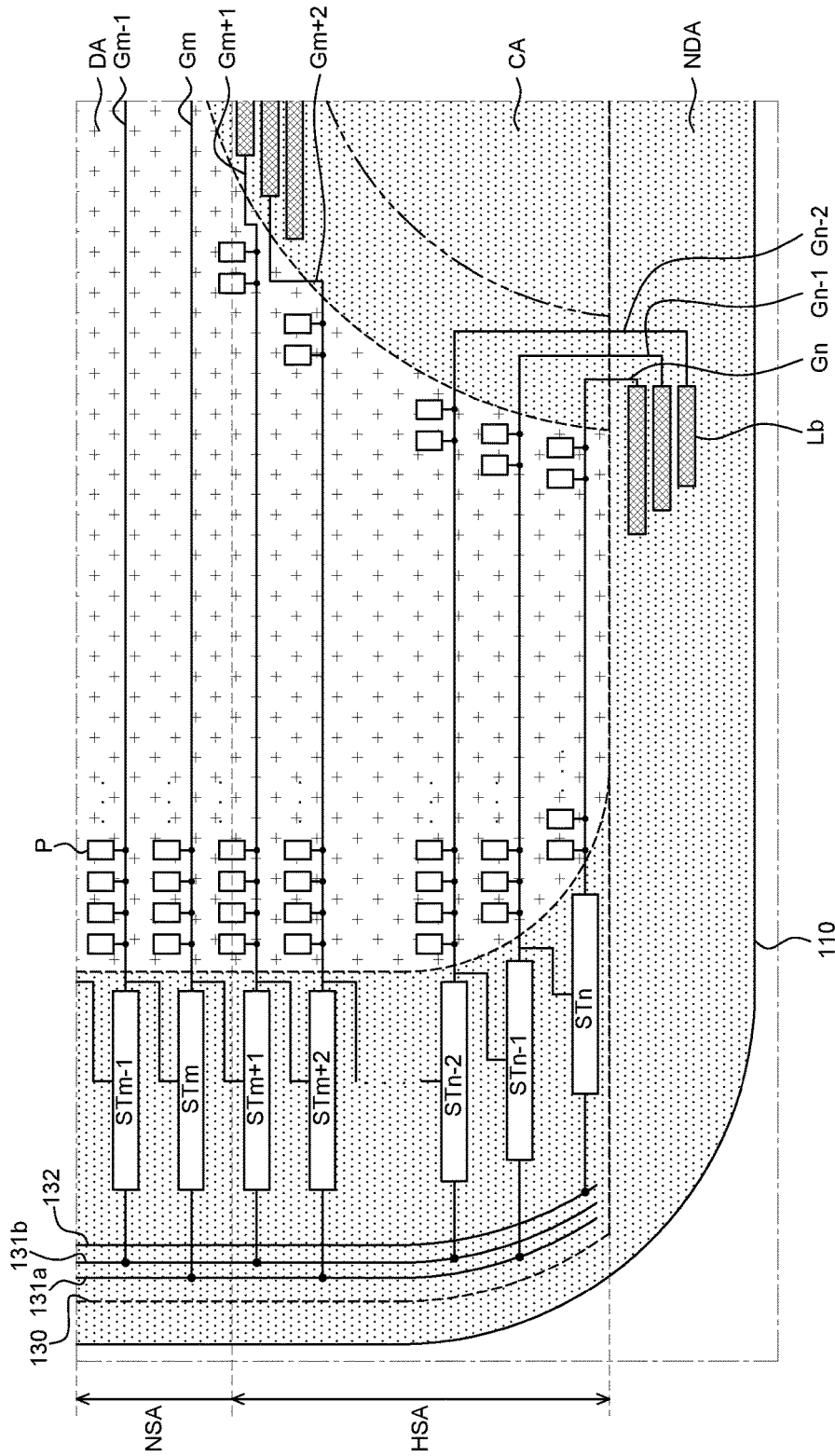
FIG. 9 is an enlarged view of portion A of FIG. 2 according to another embodiment of the present disclosure.

FIG. 9 is an enlarged view of portion A of FIG. 2 according to another embodiment of the present disclosure. FIG. 9 is a modified embodiment of the embodiment illustrated in FIG. 7 and components which overlap those in FIG. 7 will be omitted or briefly described.

As described above, the normal structure area NSA of the portion A includes a m−1-th stage STm−1 and a m-th stage STm and the heterogeneous structure area HSA includes a total of n-m stages including a m+1-th stage STm+1 to an n-th stage Stn. A pixel load L due to pixels P connected to each of the m+1-th stage STm+1 to the n-th stage STn may be smaller than a pixel load connected to any one of the m-th stage STm and stages previous to the m-th stage STm.

Difference of the load connected to each stage may cause abnormality of the output signal so that in order to lessen the difference of the loads, the auxiliary load Lb is connected to output nodes of the stages. In this case, the auxiliary load Lb may also referred to as a dummy load. Differently from the embodiment of FIG. 7, the auxiliary load Lb of the embodiment of FIG. 9 is disposed at the end of the gate line connected to the stages. In this case, there is no need to move the gate driving circuit 130 to the left in order to dispose the auxiliary load Lb, so that a bezel size may be reduced. The pixels disposed in the heterogeneous structure area HSA are disposed in the display area DA according to the shape of the heterogeneous structure. Therefore, the auxiliary load Lb may be disposed in the non-display area NDA of the heterogeneous structure area HSA according to the shape of the heterogeneous structure. Since components CA may be disposed in the non-display area formed by the lower portion of the display area DA which is inwardly concave, the auxiliary load Lb may be disposed in an empty space between an area where the components CA will be disposed and the display area DA. For example, the components CA may be a button, a speaker, a driving chip, a camera, and an LED. As mentioned above, the auxiliary load Lb is implemented by the auxiliary resistor and the auxiliary capacitor. When the space between the components CA and the display area DA is insufficient, the auxiliary load Lb may be disposed in a lower portion of the display area DA. The smaller the pixel load L due to the pixels P connected to the stage, the larger the auxiliary load Lb to be designed and disposed. For example, the auxiliary loads Lb connected to the stage may be increased in the order of the m+1-th stage STm+1, the m+2-th stage STm+2, the n−2-th stage STn−2, the n−1-th stage STn−1, and the n-th stage STn. Alternatively, when the difference of the pixel loads L connected to adjacent stages is not so large, the auxiliary loads Lb may be equal to each other.

Therefore, a dummy load is connected to the stages disposed in the heterogeneous structure area HSA and the dummy load is disposed according to a shape of the heterogeneous structure so that an abnormal driving phenomenon which may be caused due to the reduction of the load applied to the stages in the heterogeneous structure area HSA may be suppressed.

Figure 10:
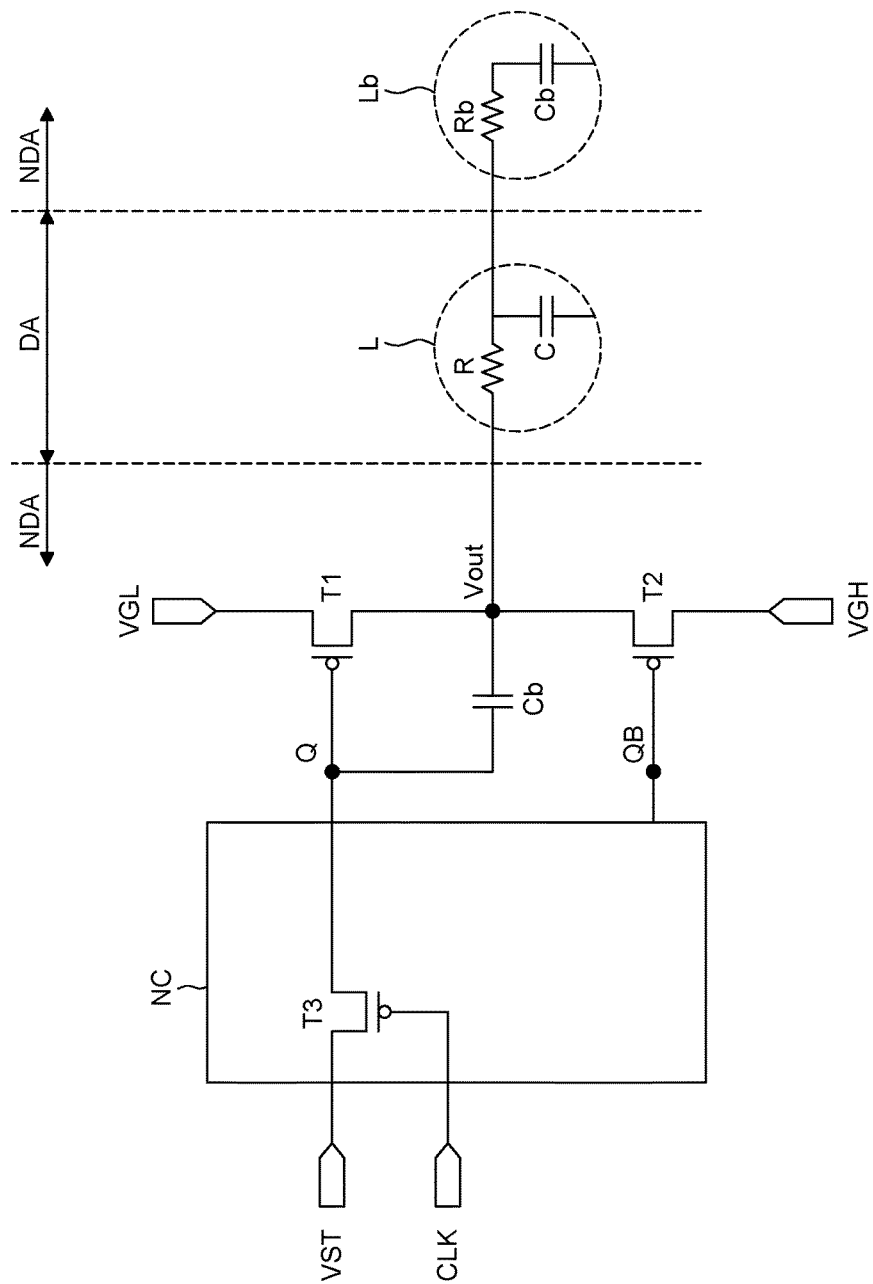
FIG. 10 is a circuit diagram illustrating each stage in a heterogeneous structure area of FIG. 9 and a load connected to each stage.

FIG. 10 is a circuit diagram illustrating each stage in a heterogeneous structure area of FIG. 9 and a load connected to each stage. FIG. 10 is a modified embodiment of the embodiment illustrated in FIG. 8 and components which overlap those in FIG. 8 will be omitted or briefly described.

As described with reference to FIG. 8, each of the stages of the gate driving circuit of FIG. 10 may include a scan stage and an emission stage. Therefore, when the circuit diagram illustrated in FIG. 10 is applied to the scan stage and the emission stage, the circuit diagram is modified to be applied to both the scan stage and the emission stage.

As an example of transistors which configure the stage, a P type transistor will be described. The stage includes a first transistor T1, a second transistor T2, a boosting capacitor Cb, and a node control unit NC. The first transistor T1 is referred to as a pull-up transistor. When a Q node for controlling the first transistor T1 is charged with a gate on voltage, the first transistor T1 is turned on. The second transistor T2 is referred to as a pull-down transistor. When a QB node for controlling the second transistor T2 is charged with a gate on voltage, the second transistor T2 is turned on. Ad, the node control unit NC controls charging and discharging of the Q node and the QB node.

Referring to FIGS. 9 and 10, the auxiliary load Lb is connected to the ends of the pixels P of the display area DA connected to the output node Vout of the stage. In the circuit diagram, pixels P disposed in the display area DA are represented as pixel loads L. The auxiliary load Lb is disposed in the non-display area NDA adjacent to the pixel load L and is represented as an auxiliary resistor Rb and an auxiliary capacitor Cb. The auxiliary load Lb is disposed so that a total of the loads applied to the output node Vout is increased. That is, the load applied to the output node Vout is a sum of the auxiliary load Lb and the pixel load L.

Figure 11:
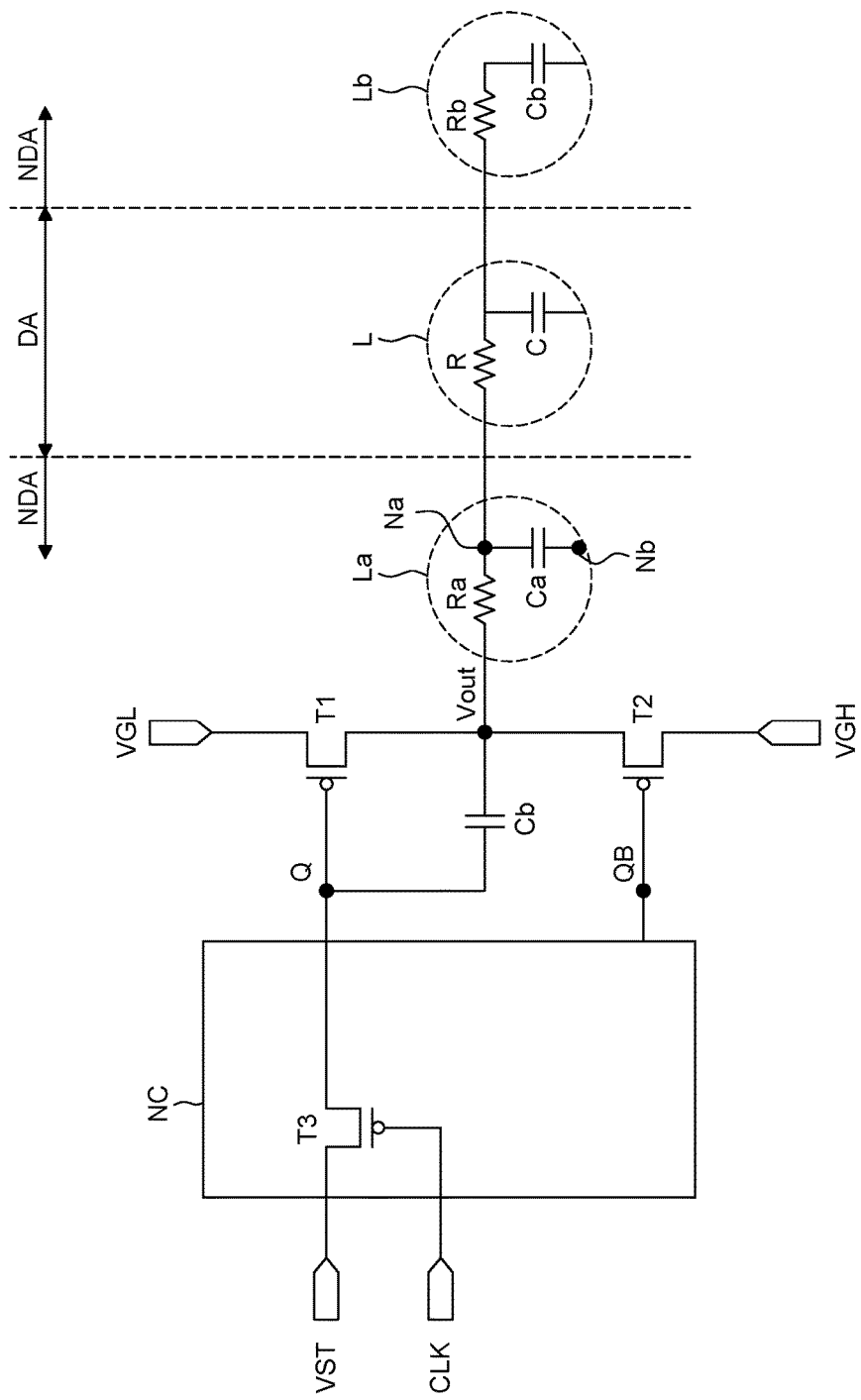
FIG. 11 is a circuit diagram illustrating a view according to another embodiment of the present disclosure of a portion A of FIG. 2.

FIG. 11 is a circuit diagram illustrating a view according to another embodiment of the present disclosure of a portion A of FIG. 2. And, FIG. 11 is a modified embodiment of the embodiment illustrated in FIG. 8 or 10 and repeated components to those in FIG. 8 or 10 will be omitted or briefly described. And, FIG. 11 is an embodiment obtained by combining FIGS. 8 and 10 so that a display device will be described with reference to FIGS. 7 and 9.

As described above, the normal structure area NSA of the portion A includes a m−1-th stage STm−1 and a m-th stage STm and the heterogeneous structure area HSA includes a total of n-m stages including a m+1-th stage STm+1 to an n-th stage STn. A size of a pixel load L due to pixels connected to each of the m+1-th stage STm+1 to the n-th stage STn may be smaller than a size of a pixel load L connected to any one of the m-th stage STm and stages previous to the m-th stage STm.

Different sizes of the load connected to each stage may cause abnormality of the output signal. Therefore, in order to decrease the size difference of the loads, auxiliary loads La and Lb are connected to output nodes of the stages. In this case, the auxiliary loads La and Lb may be referred to as dummy loads and may include a first auxiliary load La and a second auxiliary load Lb. The first auxiliary load La is disposed between the stages and the display area DA and the second auxiliary load Lb is disposed at an end of the gate line connected to the stages. When the auxiliary loads La and Lb are disposed to be divided into the first auxiliary load La and the second auxiliary load Lb, an amount by which the gate driving circuit 130 is moved to the left may be smaller than an amount by which the gate driving circuit 130 is moved to the left when only one the first auxiliary load La is disposed. Therefore, the auxiliary loads La and Lb are disposed to be divided into the first auxiliary load La and the second auxiliary load Lb so that the bezel size may be reduced. Pixels disposed in the heterogeneous structure area HSA are disposed in the display area DA according to the shape of the heterogeneous structure. Therefore, the second auxiliary load Lb may be disposed in the non-display area NDA of the heterogeneous structure area HSA according to the shape of the heterogeneous structure. Since components CA may be disposed in the non-display area convexly formed by the lower portion of the display area DA which is inwardly concave, the second auxiliary load Lb may be disposed in an empty space between an area where the components CA will be disposed and the display area DA. For example, the components CA may be a button, a speaker, a driving chip, a camera, and an LED. As mentioned above, the auxiliary loads La and Lb are implemented by the auxiliary resistors Ra and Rb and the auxiliary capacitors Ca and Cb. When the space between the components CA and the display area DA is insufficient, the second auxiliary load Lb may be disposed at a lower end of the display area DA. The smaller the size of the pixel load L due to the pixels P connected to the stage, the larger the size of the auxiliary loads La and Lb to be designed and disposed. For example, sizes of the auxiliary loads La and Lb connected to the stage may be increased in the order of the m+1-th stage STm+1, the m+2-th stage STm+2, the n−2-th stage STn−2, the n−1-th stage STn−1, and the n-th stage STn. Alternatively, when the size difference of the pixel loads L connected to adjacent stages is not so large, the sizes of the auxiliary loads La and Lb may be equal to each other. In this case, the size of the auxiliary loads La and Lb is a sum of a size of the first auxiliary load La and a size of the second auxiliary load Lb.

That is, the dummy loads are disposed in the output node of the stage disposed in the heterogeneous structure area HSA and the pixel P connected to the stage disposed in the heterogeneous structure area HSA so that an abnormal driving phenomenon which may be caused due to the reduction of the loads applied to the stages in the heterogeneous structure area HAS may be suppressed.

As described with reference to FIGS. 8 and 10, each of the stages of the gate driving circuit of FIG. 11 may include a scan stage and an emission stage. Therefore, when the circuit diagram illustrated in FIG. 11 is applied to the scan stage and the emission stage, the circuit diagram is modified to be applied to both the scan stage and the emission stage.

As an example of transistors which configure the stage, a P type transistor will be described. The stage includes a first transistor T1, a second transistor T2, a boosting capacitor Cb, and a node control unit NC. The first transistor T1 is referred to as a pull-up transistor. When a Q node for controlling the first transistor T1 is charged with a gate on voltage, the first transistor T1 is turned on. The second transistor T2 is referred to as a pull-down transistor. When a QB node for controlling the second transistor T2 is charged with a gate on voltage, the second transistor T2 is turned on. And, the node control unit NC controls charging and discharging of the Q node and the QB node.

Referring to FIG. 11, the first auxiliary load La is connected between the output node Vout and the pixel load L by the pixels in the display area DA and the second auxiliary load Lb is connected to ends of the pixels of the display area DA connected to the output node Vout. The first auxiliary load La may be represented by a first auxiliary resistor Ra and a first auxiliary capacitor Ca and the second auxiliary load Lb may be represented by a second auxiliary resistor Rb and a second auxiliary capacitor Cb. A total size of the loads applied to the output node Vout may be increased by disposing the first auxiliary load La and the second auxiliary load Lb. That is, the size of the loads applied to the output node Vout is a sum of the first auxiliary load La, the second auxiliary load Lb, and the pixel load L.

Figure 12:
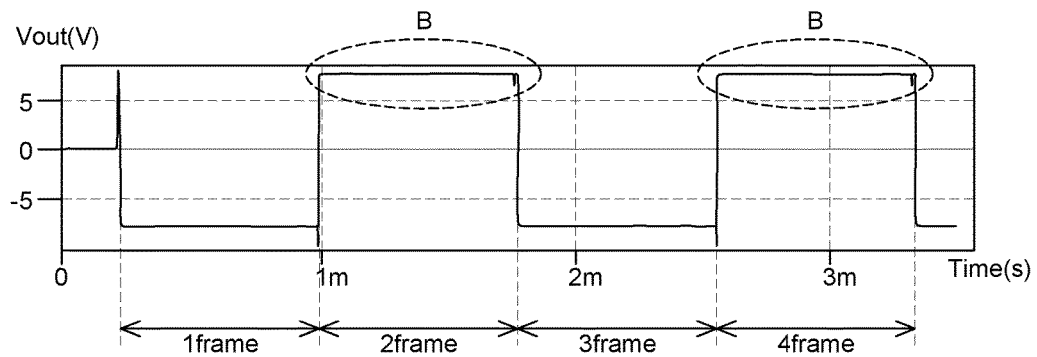
FIG. 12 is a waveform of Vout output from a stage of FIG. 5.

FIG. 12 is a waveform of Vout output from a stage of FIG. 5. In detail, FIG. 12 is a waveform output from the output node Vout of stages disposed in the heterogeneous structure area HSA. For example, the stages disposed in the heterogeneous structure area HSA are emission stages as n-th stage STn and a gate low voltage VGL is −8 V and a gate high voltage VGH is +8 V.

Referring to FIGS. 6 and 12, an operation of each stage may include an initializing period, a sampling period, and an emitting period. The initializing period, the sampling period, and the emitting period may be defined as one frame. Most of one frame is occupied by the emitting period. When one frame begins or ends, the initializing period and the sampling period are provided. During the initializing period and the sampling period, the second transistor T2 is turned on and during the emitting period, the first transistor T1 is turned on. That is, during the most period of one frame, the first transistor T1 is turned on. For example, in the n-th stage STn, when a first frame 1frame ends and a second frame 2frame begins, the second transistor T2 is turned on to perform initialization and sampling of the pixel driving circuit for driving the pixels P connected to the n-th stage STn. In this case, the output node Vout is supplied with the gate high voltage VGH. And, next to the initializing period and the sampling period, the emitting period for allowing the pixels P to emit light is performed. As described above, during the emitting period, the first transistor T1 is turned on so that the gate low voltage VGL is applied to the output node Vout. Therefore, the third transistor T3 is turned on by the gate low voltage VGL of the clock signal CLK to supply the gate low voltage VGL to the Q node. Simultaneously, the first transistor T1 is turned on by the gate low voltage VGL applied to the Q node to supply the gate low voltage VGL to the output node Vout. In this case, since the Q node is floated, the output node Vout is applied with the gate low voltage VGL so that the floated Q node is boosted and a voltage of the Q node drops to a voltage which is lower than the gate low voltage VGL. Therefore, the gate low voltage VGL is stably supplied to the gate electrode of the pixels P connected to the output node Vout.

And, since the clock signal CLK input to the n-th stage STn is far from the integrated driving circuit 120, the input of the gate low voltage VGL to the Q node is delayed due to the increase of the load of the clock line. And, the gate low voltage VGL is rapidly applied to the output node Vout in a state when the Q node is not floated, so that the Q node is not boosted. Therefore, since the gate low voltage VGL is not provided to the output node Vout, an abnormal driving phenomenon in which the gate high voltage VGH supplied to the output node Vout during the initializing period and the sampling period is continuously maintained even during the emitting period of the second frame 2frame may be generated. The reason why the voltage of the output node Vout rapidly drops through the first transistor T1 is because the size of the pixel load L applied to the output node Vout is small. And, since the clock signal CLK is one, the floating of the Q node and the boosting of the Q node is to be performed in one clock. Even though one or more clock signals CLK are used, the rapid reduction of the pixel load L may generate an abnormal signal B from the stages. Therefore, the stages which are disposed in the heterogeneous structure area HSA including a heterogeneous structure to have a reduced pixel load L provides an abnormal signal B to the output node Vout to cause problems such as screen flickering.

Figure 13:
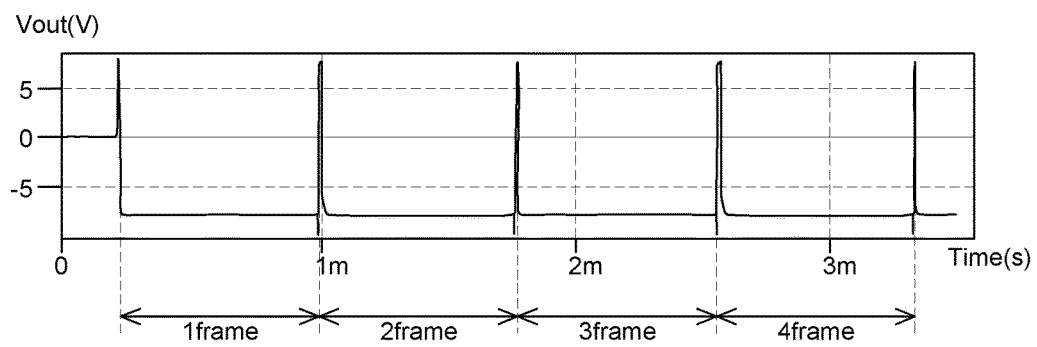
FIG. 13 is a waveform of Vout output from each stage of FIG. 7, 9, or 11.

FIG. 13 is a waveform of Vout output from each stage of FIG. 7, 9, or 11. In detail, FIG. 13 is a waveform output from the output node Vout of stages disposed in the heterogeneous structure area HSA. For example, the stages disposed in the heterogeneous structure area HSA are emission stages as n-th stage STn and a gate low voltage VGL is −8 V and a gate high voltage VGH is +8 V.

Referring to FIG. 8 or 10 and 13, an operation of each stage may include an initializing period, a sampling period, and an emitting period. The initializing period, the sampling period, and the emitting period may be defined as one frame. And, a pixel driving circuit for driving a pixel may include a driving transistor, an emitting transistor, and transistors which sample the driving transistor and inputs a data signal. The driving transistor supplies a current with a predetermined magnitude to the pixel according to the data signal and the emitting transistor may control the flow of current applied to the pixel so that the pixel emits light only during the emitting period. In this case, a transistor which is turned on during the sampling period to compensate a threshold voltage of the driving transistor is referred to as a sampling transistor.

For example, a case in which the output node Vout is connected to a gate electrode of the emitting transistor of the pixel driving circuit will be described. That is, during the emitting period, a turn-on voltage is supplied to the gate electrode of the emitting transistor. And, during a non-emitting period, a turn-off voltage is supplied to the gate electrode of the emitting transistor.

Therefore, referring to the waveform of FIG. 13, most of one frame is occupied by the emitting period. When one frame begins or ends, the initializing period and the sampling period are provided. During the initializing period and the sampling period, the second transistor T2 is turned on and during the emitting period, the first transistor T1 is turned on. That is, during the most period of one frame, the first transistor T1 is turned on. For example, when a first frame 1frame ends and a second frame 2frame begins, the second transistor T2 is turned on to perform initialization and sampling on the pixel driving circuit for driving the pixels P connected to the n-th stage STn. In this case, the output node Vout is supplied with the gate high voltage VGH. And, next to the initializing period and the sampling period, the emitting period for allowing the pixels P to emit light proceeds. As described above, during the emitting period, the first transistor T1 is turned on so that the gate low voltage VGL is applied to the output node Vout. The third transistor T3 is turned on by the gate low voltage VGL of the clock signal CLK to supply the gate low voltage VGL to the Q node. Simultaneously, the first transistor T1 is turned on by the gate low voltage VGL applied to the Q node to supply the gate low voltage VGL to the output node Vout. In this case, since the Q node is floated, the output node Vout is applied with the gate low voltage VGL so that the floated Q node is boosted and a voltage of the Q node drops to a voltage which is lower than the gate low voltage VGL. Therefore, the gate low voltage VGL is stably supplied to the gate electrode of the pixels P connected to the output node Vout.

Therefore, by disposing auxiliary loads La or Lb connected to the output node Vout of the emission stage with a reduced pixel load in the non-display area NDA, a gate turn-on voltage may be supplied to the gate electrode of the pixel array during the emitting period.

Hereinafter, for example, a case in which the output node Vout is connected to a gate electrode of the sampling transistor which is turned on during the sampling period will be described. That is, during the sampling period, a turn-on voltage is supplied to the gate electrode of the sampling transistor and during periods other than the sampling period, a turn-off voltage is supplied to the gate electrode of the sampling transistor.

As described above, due to the reduction of the load connected to the output node Vout, the sampling (or a compensation time) of the driving transistor may be delayed. That is, an abnormal driving phenomenon in which not a gate low voltage VGL, but a gate high voltage VGH is applied to the output node Vout during the sampling period may occur. The abnormal driving phenomenon may be solved by ensuring the reliability of the driving transistor by disposing auxiliary loads La or Lb connected to the output node Vout of the scan stage with a reduced pixel load in the non-display area according to one or more embodiments of the present disclosure to suppress the delay of the compensation time.

Figure 14A:
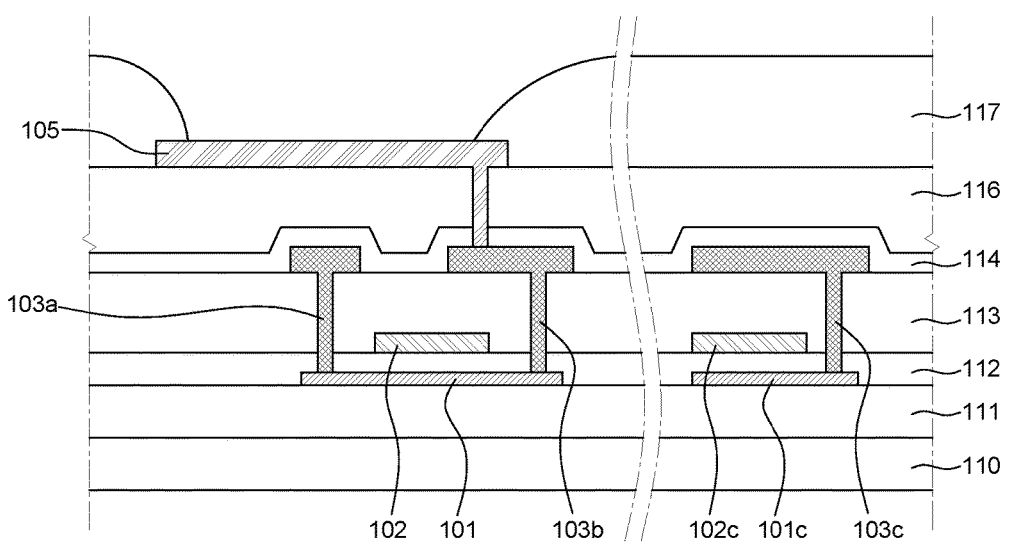
FIG. 14A is a view according to a first embodiment of the present disclosure illustrating a structure of an auxiliary load illustrated in FIG. 8, 10, or 11.

FIG. 14A is a view according to a first embodiment of the present disclosure illustrating a structure of an auxiliary load illustrated in FIG. 8, 10 or 11. In FIG. 14A, a driving transistor which configures a pixel driving circuit disposed in the pixel array and auxiliary capacitors Ca and Cb in the auxiliary loads La and Lb of FIG. 8 or 10 are illustrated.

For example, the driving transistor is illustrated to have a coplanar structure of a top gate type, but is not limited thereto. The driving transistor includes a gate electrode, an active layer, a source electrode, and a drain electrode.

The active layer 101 of the driving transistor is disposed on the substrate 110 and a gate insulating layer 112 is disposed on the active layer 101 so that the gate insulating layer 112 may insulate the gate electrode 102 and the active layer 101 on the gate insulating layer 112 from each other. The gate electrode 102 may also be referred to as a first gate electrode.

The substrate 110 is a base substrate on which a driving circuit and an organic light emitting element are laminated and is formed of a material such as glass, or plastic or metal so as to allow the substrate 110 to be curved or bent. An insulating layer such as a buffer layer 111 may be disposed between the substrate 110 and the active layer 101. The buffer layer 111 may allow the substrate 110 and the active layer 101 to be easily coupled to each other.

When the active layer 101 is formed of an oxide semiconductor, the active layer 101 may be formed of indium tin oxide (ITO), indium zinc oxide (IZO), indium gallium zinc oxide (IGZO), indium tin zinc oxide (ITZO), or the like, but is not limited thereto. The active layer 101 may be formed of amorphous silicon (a-Si), polycrystalline silicon (poly-Si), an organic semiconductor, or the like.

A first intermediate layer 113 is disposed on the gate electrode 102 and the active layer 101 of the driving transistor is in contact with a source electrode 103a and a drain electrode 103b through contact holes formed in the gate insulating layer 112 and the first intermediate layer 113, respectively. And, a passivation layer 114 is disposed on the source electrode 103a and the drain electrode 103b. The passivation layer 114 may protect the driving transistor from contamination or damages. A planarization layer 116 is disposed on the passivation layer 114 so that a step on the substrate 110 due to the formation of the driving transistor and the wiring lines may be gentle.

The gate electrode 102, the source electrode 103a, and the drain electrode 103b may be a semiconductor such as silicon Si or any one of a conductive metal such as molybdenum (Mo), aluminum (Al), chrome (Cr), gold (Au), titanium (Ti), nickel (Ni), neodymium (Nd), and copper Cu or an alloy of two or more thereof, or multiple layers thereof.

The gate insulating layer 112 and the first intermediate layer 113 may be silicon oxide SiOx, silicon nitride SiNx, or multiple layers thereof. The passivation layer 114 and the planarization layer 116 may be formed of one of acrylic-based resin, epoxy resin, phenol resin, polyamide-based resin, polyimide-based resin, unsaturated polyester-based resin, polyphenylene-based resin, polyphenylene sulfide-based resin, benzocyclobutene and photoresist, but is not limited thereto.

An anode 105 is disposed on the planarization layer 116. The anode 105 may be connected to the drain electrode 103b of the driving transistor through contact holes formed in the passivation layer 115 and the planarization layer 116. The anode 105 may be formed of a semitransparent or transparent metallic material. For example, the anode 105 may be formed of a transparent conductive material such as tin oxide TO, indium tin oxide ITO, indium zinc oxide IZO, indium tin zinc oxide ITZO, and the like, but is not limited thereto. When an organic light emitting element is applied to a top emission type display panel, the anode 105 may further include a reflective layer which is formed of a material having excellent reflectivity such as silver Ag or a silver alloy (Ag alloy) below the transparent conductive layer as described above. Therefore, the anode 105 may upwardly reflect light generated from the organic light emitting layer.

The auxiliary capacitor Ca according to the first embodiment is implemented by a first electrode 101c and a second electrode 102c and the second electrode 102c and a third electrode 103c. An auxiliary capacitor formed by the first electrode 101c and the second electrode 102c may be referred to as a first auxiliary capacitor and an auxiliary capacitor formed by the second electrode 102c and the third electrode 103c may be referred to as a second auxiliary capacitor. The first electrode 101c is formed of the same material on the same layer as the active layer 101 of the driving transistor. The second electrode 102c is formed of the same material on the same layer as the gate electrode 102 of the driving transistor. The third electrode 103c is formed of the same material on the same layer as the source electrode 103a and the drain electrode 103b. The first electrode 101c, the second electrode 102c, and the third electrode 103c are conductors to function as capacitors. Therefore, the first electrode 101c which is formed of the same material as the active layer 101 of the driving transistor may be doped after being deposited to be conductivized. In order to dope the first electrode 101c, a separate doping process other than the doping process of the active layer 101 is necessary. Therefore, when the first electrode functions as the auxiliary capacitor without adding a separate doping process, a constant voltage is applied to the first electrode so that the first electrode may function as one electrode of the auxiliary capacitor. That is, the third electrode 103c to which a constant voltage is applied is connected to the first electrode 101c to be functioned as a conductor. The first electrode 101c forms contact holes in the gate insulating layer 112 and the first intermediate layer 113 to be connected to the third electrode 103c to be supplied with the constant voltage and forms a first capacitance together with the second electrode 102c. And, the second electrode 102c and the third electrode 103c form a second capacitance. A capacitance of the auxiliary capacitor is a sum of the first capacitance and the second capacitance. The first capacitance formed between the first electrode 101c and the second electrode 102c is proportional to an area of the first electrode 101c or the second electrode 102c and is inversely proportional to a distance between the first electrode 101c and the second electrode 102c. The distance between the first electrode 101c and the second electrode 102c may correspond to the thickness of the gate insulating layer 112. And, the second capacitance formed between the second electrode 102c and the third electrode 103c is proportional to an area of the second electrode 102c or the third electrode 103c and is inversely proportional to a distance between the second electrode 102c and the third electrode 103c. The distance between the second electrode 102c and the third electrode 103c may correspond to the thickness of the first intermediate layer 113.

Referring to FIG. 8, the second electrode 102c is connected to the first node Na to be connected to the output node Vout through an auxiliary line. The auxiliary line may be formed of the same material on the same layer as the second electrode 102c and forms an auxiliary resistor Ra. And, the first electrode 101c and the third electrode 103c serve as a second node Nb and a constant voltage is applied to the first electrode 101c and the third electrode 103c. For example, the constant voltage may be a high potential driving voltage, but is not limited thereto. The second electrode 102c of the auxiliary capacitor Ca extends as a gate electrode of the display area DA.

Referring to FIG. 10, a gate electrode which is connected to the output node Vout to transmit a gate signal to the pixels extends to be connected to the second electrode 102c which is one electrode of the auxiliary capacitor Cb. A part of the gate electrode extending to the non-display area NDA may form an auxiliary resistor Rb. And, the first electrode 101c and the third electrode 103c are other electrodes of the auxiliary capacitor Cb and are applied with a constant voltage. For example, the constant voltage may be a high potential driving voltage, but is not limited thereto.

Figure 14B:
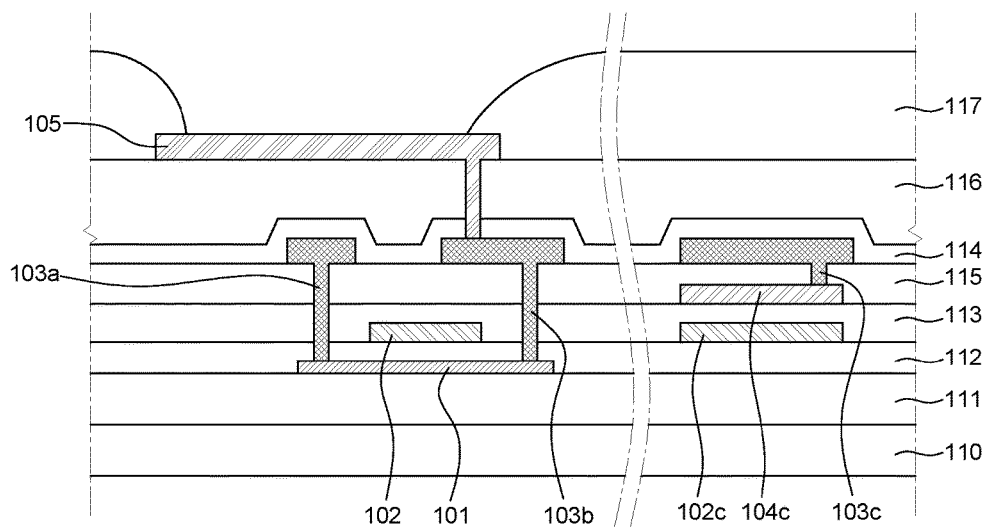
FIG. 14B is a view according to a second embodiment of the present disclosure illustrating a structure of an auxiliary load illustrated in FIG. 8, 10, or 11.

FIG. 14B is a view according to a second embodiment of the present disclosure illustrating a structure of an auxiliary load illustrated in FIG. 8. FIG. 14B is a modified embodiment of the first embodiment illustrated in FIG. 14A and components which overlap those in FIG. 14A will be omitted or briefly described.

An auxiliary capacitor Ca according to a second embodiment of the present disclosure is implemented by the second electrode 102c and a fourth electrode 104c. The second electrode 102c is formed of the same material on the same layer as the gate electrode 102. The fourth electrode 104c is disposed on the first intermediate layer 113. A second intermediate layer 115 is disposed between the fourth electrode 104c and the source electrode 103a and drain electrode 103b and the fourth electrode 104c may be formed of the same material as the second electrode 102c or the third electrode 103c.

In the case of a high resolution display device, a number of data routing lines which apply a data signal from an integrated driving circuit to a data line disposed in the display area is increased. An exposure process of a process of depositing a data routing line requires a predetermined exposure interval between the data routing lines. For example, when the data routing line is formed of a single metal, it is difficult to secure the exposure interval. Therefore, in addition to the second electrode 102c, the fourth electrode 104c is additionally disposed to be used as a data routing line, so that it is easy to deposit the data routing line. In this case, the fourth electrode 104c may also be referred to as a second gate electrode.

Referring to FIG. 8, the second electrode 102c serves as a first node Na and is connected to the output node Vout through an auxiliary line. The auxiliary line may be formed of the same material on the same layer as the second electrode 102c and forms an auxiliary resistor Ra. And, the fourth electrode 104c serves as a second node Nb and is applied with a constant voltage. In order to apply a constant voltage to the fourth electrode 104c, the third electrode 103c is connected to the fourth electrode 104c to apply a high potential power voltage. The third electrode 103c may be connected to the fourth electrode 104c through a contact hole formed in the second intermediate layer 115. The second electrode 102c of the auxiliary capacitor Ca extends as a gate electrode of the display area DA.

Referring to FIG. 10, a gate electrode which is connected to the output node Vout to transmit a gate signal to the pixels extends to be connected to the second electrode 102c which is one electrode of the auxiliary capacitor Cb. A part of the gate electrode extending to the non-display area NDA may form an auxiliary resistor Rb. And, the fourth electrode 104c serves as the other electrode of the auxiliary capacitor Cb and is applied with a constant voltage. In order to apply a constant voltage to the fourth electrode 104c, the third electrode 103c is connected to the fourth electrode 104c to apply a high potential driving voltage. The third electrode 103c may be connected to the fourth electrode 104c through a contact hole formed in the second intermediate layer 115.

As described above, the capacitance formed between the second electrode 102c and the fourth electrode 104c is proportional to an area of the electrode and is reversely proportional to a distance between the second electrode 102c and the fourth electrode 104c. The distance between the second electrode 102c and the fourth electrode 104c may correspond to the thickness of the first intermediate layer 113. And, the thickness of the first intermediate layer 113 may be smaller than the thickness of the gate insulating layer 112. Therefore, when the areas of the electrodes which form the auxiliary capacitors according to the first and second embodiments are equal to each other, the capacitance of the auxiliary capacitor of the second embodiment is larger than the capacitance of the auxiliary capacitor of the first embodiment.

Figure 14C:
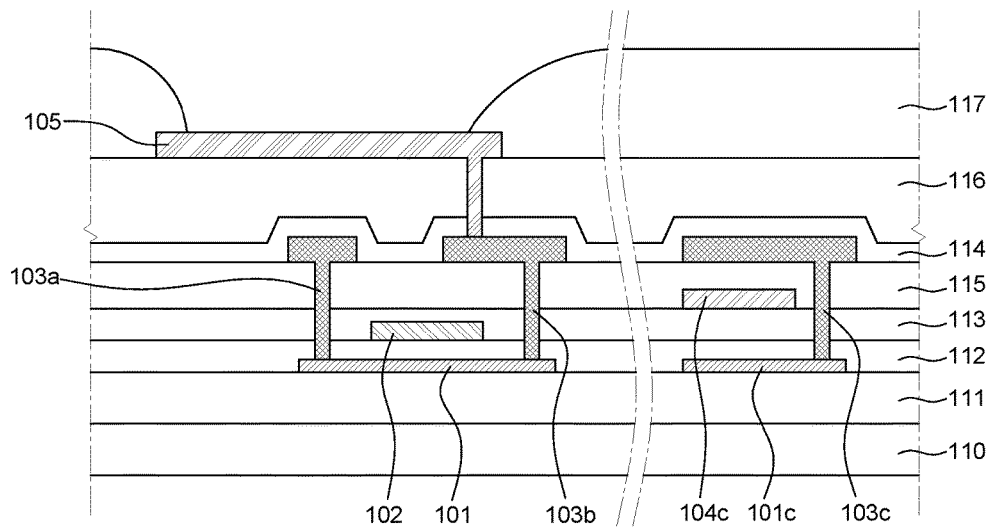
FIG. 14C is a view according to a third embodiment of the present disclosure illustrating a structure of an auxiliary load illustrated in FIG. 8, 10, or 11.

FIG. 14C is a view according to a third embodiment of the present disclosure illustrating a structure of an auxiliary load illustrated in FIG. 8 or 10. FIG. 14C is a modified embodiment of the first embodiment illustrated in FIG. 13A and components which overlap those in FIG. 14A will be omitted or briefly described.

An auxiliary capacitor Ca according to the third embodiment is implemented by the first electrode 101c and the fourth electrode 104c and the third electrode 103c and the fourth electrode 104c. An auxiliary capacitor formed by the first electrode 101c and the fourth electrode 104c may be referred to as a third auxiliary capacitor and an auxiliary capacitor formed by the third electrode 103c and the fourth electrode 104c may be referred to as a fourth auxiliary capacitor. The first electrode 101c is formed of the same material on the same layer as the active layer 101 and the third electrode 103c is formed of the same material on the same layer as the source electrode 103a and the drain electrode 103b. And, the fourth electrode 104c is disposed between the first electrode 101c and the third electrode 103c and is formed of the same material as the second electrode 102c or the third electrode 103c. As mentioned above, all the first electrode 101c, the third electrode 103c, and the fourth electrode 104c are conductors in order to serve as auxiliary capacitors. Therefore, the first electrode 101c which is formed of the same material as the active layer 101 of the driving transistor may be doped after being deposited to be conductivized. A process of forming the first electrode 101c of the auxiliary capacitor Ca to be conductivized may be performed simultaneously with the process of forming the active layer 101 in a portion which is in contact with the source electrode 103a and the drain electrode 103b of the driving transistor to be conductivized. Therefore, a separate process does not need to be additionally performed. Alternatively, when the first electrode 101c, the third electrode 103c, and the fourth electrode 104c serve as the auxiliary capacitor similarly to the first embodiment of FIG. 14A, a constant voltage is applied to the first electrode 101c so that the electrodes may serve as one electrode of the auxiliary capacitor.

Referring to FIG. 8, the fourth electrode 104c serves as a first node Na and is connected to the output node Vout through an auxiliary line. The auxiliary line may be formed on the same layer as the fourth electrode 104c with the same material and forms an auxiliary resistor Ra. And, the first electrode 101c or the third electrode 103c serves as a second node Nb and is applied with a constant voltage. In order to apply a constant voltage to the first electrode 101c, the third electrode 103c is connected to the first electrode 101c to apply a high potential power voltage. The first electrode 101c may be connected to the third electrode 103c through contact holes formed in the gate insulating layer 112, the first intermediate layer 113, and the second intermediate layer 115. The fourth electrode 104c of the auxiliary capacitor Ca extends as a gate electrode of the display area DA.

Referring to FIG. 10, a gate electrode which is connected to the output node Vout to transmit a gate signal to the pixels extends to be connected to the fourth electrode 104c which is one electrode of the auxiliary capacitor Cb. A part of the gate electrode extending to the non-display area NDA may form an auxiliary resistor Rb. And, the first electrode 101c or the third electrode 103c are other electrodes of the auxiliary capacitor Cb and are applied with a constant voltage. In order to apply a constant voltage to the first electrode 101c, the third electrode 103c is connected to the first electrode 101c to apply a high potential driving voltage. The first electrode 101c may be connected to the third electrode 103c through contact holes formed in the gate insulating layer 112, the first intermediate layer 113, and the second intermediate layer 115.

The first electrode 101c and the fourth electrode 104c form a third capacitance and the third electrode 103c and the fourth electrode 104c form a fourth capacitance. Therefore, a capacitance of the auxiliary capacitor is a sum of the third capacitance and the fourth capacitance. The third capacitance formed between the first electrode 101c and the fourth electrode 104c is proportional to an area of the first electrode 101c or the fourth electrode 104c and is inversely proportional to a distance between the first electrode 101c and the fourth electrode 104c. The distance between the first electrode 101c and the fourth electrode 104c may correspond to the thickness of the gate insulating layer 112 and the first intermediate layer 113. And, a fourth capacitance formed between the third electrode 103c and the fourth electrode 104c is proportional to an area of the third electrode 103c or the fourth electrode 104c and is inversely proportional to a distance between the third electrode 103c and the fourth electrode 104c. The distance between the third electrode 103c and the fourth electrode 104c may correspond to the thickness of the second intermediate layer 115. The thickness of the first intermediate layer 113 is smaller than the thickness of the gate insulating layer 112 and the thickness of the second intermediate layer 115 is larger than the thickness of the gate insulating layer 112. Therefore, when areas of the electrodes which form auxiliary capacitor of the first embodiment, the second embodiment, and the third embodiment are equal to each other, the capacitance of the auxiliary capacitor of the third embodiment is similar to the capacitance of the auxiliary capacitor of the first embodiment and is smaller than the capacitance of the auxiliary capacitor of the second embodiment. When a distance between two electrodes which form the auxiliary capacitor is too close, static electricity is generated between two electrodes during a manufacturing process, which may affect other components, for example, a capacitor, the driving transistor, or the like. Therefore, even though a size of the capacitance is not the largest, the auxiliary capacitor of the third embodiment which may stably form components during the manufacturing process may be more effective.

Figure 15:
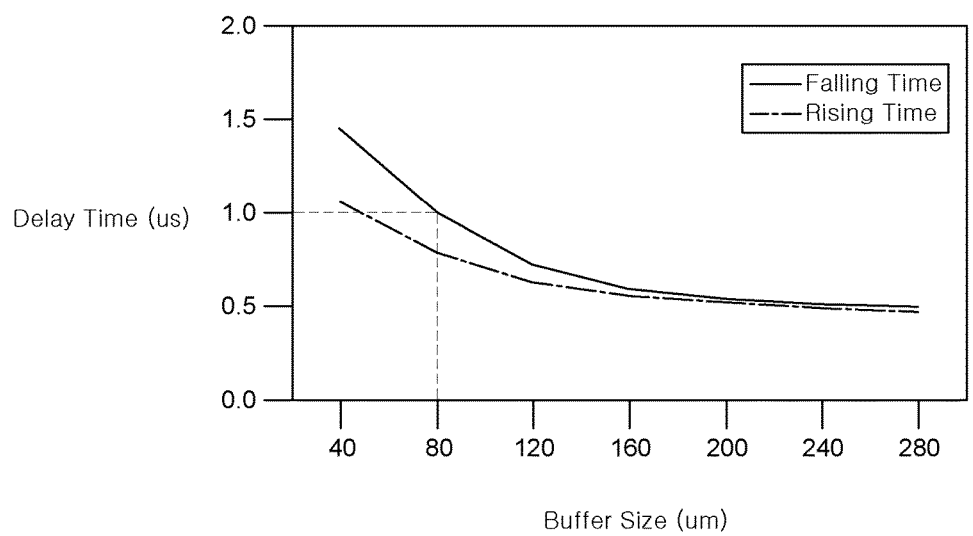
FIG. 15 is a graph illustrating a delay time according to a size of a buffer transistor.

FIG. 15 is a graph illustrating a delay time according to a size of a buffer transistor.

The buffer transistor refers to a first transistor and a second transistor which configure the stages. For example, in the case of scan stages which supply a signal to a gate electrode of a scan transistor of a pixel driving circuit, there may be a difference between a delay time of the output signal of the scan stages due to the difference in the pixel load for every gate line. During the sampling period, a deviation of a voltage difference between the gate electrode and the source electrode of the driving transistor is generated due to the difference in the delay time of the output signal. Therefore, a luminance difference between the pixels may be generated. Therefore, the auxiliary load is disposed in the heterogeneous structure area so as to reduce a deviation of the pixel load. According to the embodiment of FIG. 7 or 9, there may be a limit in an area in which the auxiliary load La may be disposed in the display area to implement a narrow bezel display device. When the auxiliary load La is not sufficiently formed due to the insufficient space, a deviation of the sum of the pixel load L and the auxiliary load La between the gate lines may not be reduced. When a load amount of the auxiliary load is insufficient due to an insufficient space, a size of a buffer transistor disposed in a heterogeneous structure area is formed to be smaller than a size of a buffer transistor disposed in a normal structure area, thereby suppressing irregularity of a luminance due to a deviation of the load.

Referring to FIG. 15, the smaller the size of the buffer transistor, the longer the delay of the output signal to be output from the stage. A degree of delay of the output signal is determined according to a degree of delay of a falling time and a rising time. According to the embodiment of the present disclosure, the size of the buffer transistor may be determined so that the delay time of the buffer transistor is 1 µs or shorter. In order to form the delay time of the rising time and the falling time of the output signal 1 µs or shorter, the size of the buffer transistor may be 80 µm or larger. And, as the size of the buffer transistor is increased, the delay time of the output signal is converged to 0.5 µs, so that the size of the buffer transistor may be 240 µm or smaller. In this case, the size of the buffer transistor may be a width of the active layer of the buffer transistor. Therefore, the active layer of the buffer transistor disposed in the heterogeneous structure area is formed to have a size of 80 µm or larger and 240 µm or smaller so that non-uniformity of the luminance due to the deviation of the load may be suppressed.

Figure 16:
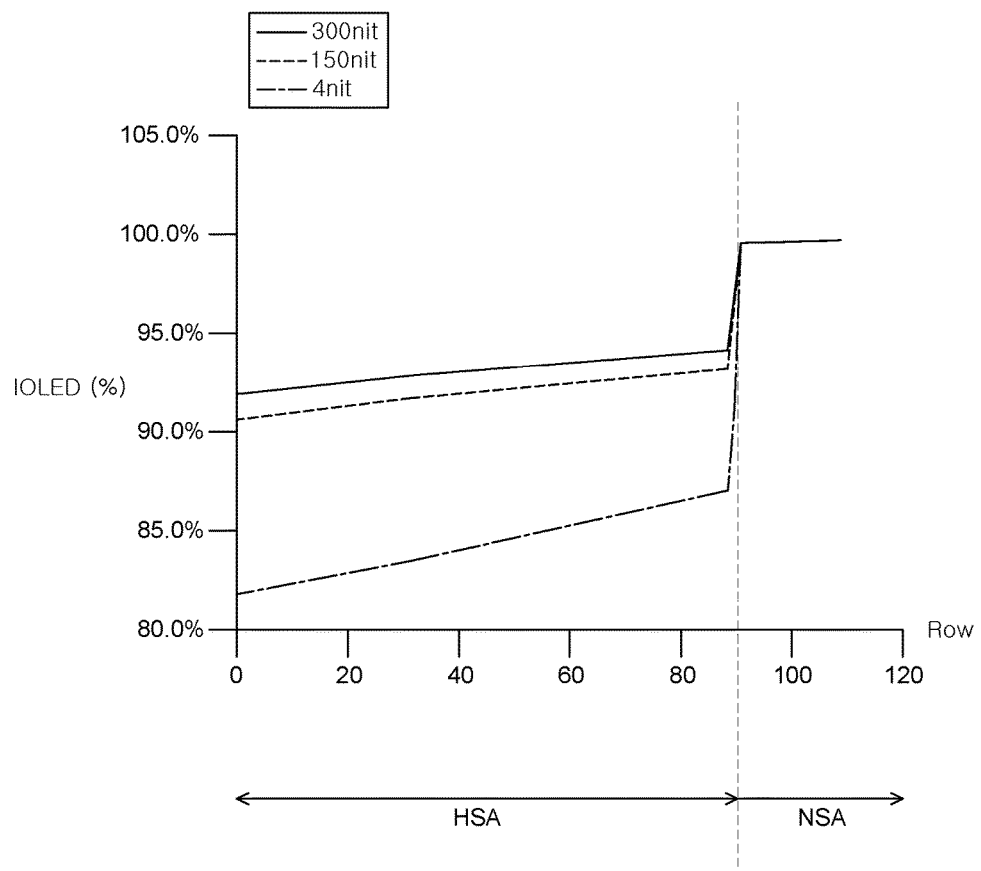

FIG. 16 is a graph illustrating a current level of an organic light emitting element for each area in a display device to which FIG. 5 is applied.

In FIG. 5, a display device using an organic light emitting element will be described as an example of a display device in which an auxiliary load is not disposed in a heterogeneous structure area HSA. Referring to FIG. 4, for example, when the n-th gate line Gn disposed at a lower portion of the display device is the first row and the first gate line G1 is an n-th row, the heterogeneous structure area HSA includes from the first row to the ninetieth row and the normal structure area NSA includes ninety-first or higher rows. When three luminances of 300 nit, 150 nit, and 4 nit are applied to the display device, it is confirmed that 100% luminance in the normal structure area NSA is sharply lowered to 95% or lower in the heterogeneous structure area HSA. And, the luminance tends to be lowered from the ninetieth row to the first row also in the heterogeneous structure area HSA and the lowering of the luminance is more significant when the luminance is low.

Figure 17:
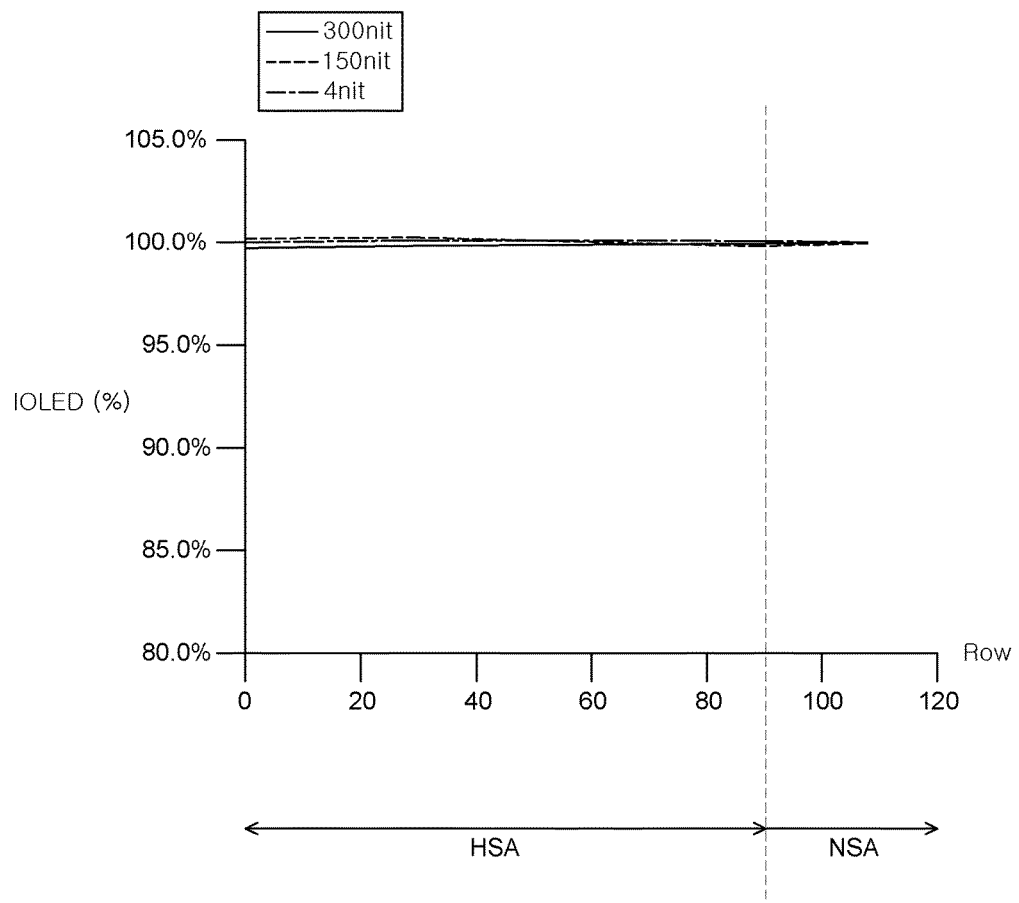

FIG. 17 is a graph illustrating a current level of an organic light emitting element for each area in a display device to which FIG. 7 or 9 is applied.

In FIG. 7, 9, or 11, a display device using an organic light emitting element will be described as an example of a display device in which an auxiliary load is disposed in a heterogeneous structure area HSA. Similarly to the display device of FIG. 16, a gate line in the lower portion of the display device is the first row and a gate line in the upper portion of the display device is the n-th row. The heterogeneous structure area HSA includes from the first row to the ninetieth row and the normal structure area NSA includes ninety-first or higher rows. When three luminances of 300 nit, 150 nit, and 4 nit are applied to the display device, it is confirmed that 100% luminance in the normal structure area NSA is not lowered and also 100% in the heterogeneous structure area HSA.

Therefore, when the pixel load applied to the stage is reduced, an auxiliary load is disposed in the output node of the stage so that the luminance lowering phenomenon caused by the reduction of the load may be suppressed.

A gate driving circuit according to one or more embodiments of the present disclosure and a display device using the same can also be described as follows:

According to an embodiment of the present disclosure, The display device comprises a display panel including a display area having a plurality of pixels connected to a plurality of gate lines, a gate driving circuit disposed in a non-display area adjacent to the display area and including a plurality of stages supplying a gate signal to the plurality of gate lines, and an auxiliary load connected to at least one stage of the plurality of stages in the non-display area. A number of the plurality of pixels which are connected to at least two gate lines among the plurality of gate lines varies. Therefore, it is possible to implement the display device which suppresses an abnormal driving phenomenon due to imbalance of the load applied to each stage of the gate driving circuit and provides a uniform output characteristic.

According to one or more embodiments, the auxiliary load may include a capacitor and a resistor and may be located between the display area and at least one stage among the plurality of stages or at the end of the gate line.

According to one or more embodiments, the smaller the number of the plurality of pixels connected to the plurality of gate lines, the larger the auxiliary load.

According to one or more embodiments, the auxiliary load may include at least two electrodes, the at least two electrodes may be overlapped with each other.

According to one or more embodiments, one electrode of the at least two electrodes may be connected to an output node of a stage in which the auxiliary load is disposed and the gate line, and a constant voltage may be applied to the other electrode of the at least two electrodes so that the at least two electrodes form a capacitor.

According to one or more embodiments, each of the plurality of stages may include a first transistor and a second transistor which are connected in series, the first transistor and the second transistor may be connected to an output node of a stage having the first transistor and the second transistor, and the auxiliary load may be connected to the output node and may be located between the output node and pixels corresponding to each of the plurality of stages, or the auxiliary load may be located at the end of the gate line.

According to one or more embodiments, a size of an active layer of any one of the first transistor and the second transistor included in the stages corresponding to the heterogeneous structure area of the display panel may be smaller than a size of an active layer of any one of the first transistor and the second transistor included in the stages corresponding to the normal structure area of the display panel.

According to one or more embodiments, a width of the active layer of any one of the first transistor and the second transistor in each of the plurality of stages corresponding to the heterogeneous structure area may be 80 µm or larger and 240 µm or smaller.

According to one or more embodiments, the plurality of stages may include emission stages which are connected to the plurality of gate lines, respectively, a pixel driving circuit which drives the plurality of pixels may include a driving transistor and an emitting transistor which controls emission of the plurality of pixels, and the emitting transistor may be turned on while the plurality of pixels emits light.

According to another embodiment of the present disclosure, the display device comprises a display panel including a display area having a normal structure area and a heterogeneous structure area and a non-display area adjacent to the display area. The display panel includes gate lines, a plurality of pixels connected to the gate lines, a gate driving circuit having stages supplying a gate signal to the gate lines in the non-display area, and a dummy load connected to stages connected to the plurality of pixels in the heterogeneous structure area, the dummy load being in the non-display area. Therefore, it is possible to implement the display device which suppresses an abnormal driving phenomenon due to imbalance of the load applied to each stage of the gate driving circuit and provides a uniform output characteristic.

According to one or more embodiments, the heterogeneous structure area may include a heterogeneous structure which is not defined as a polygon, and the dummy load may be adjacent to the plurality of pixels according to a shape of the heterogeneous structure.

According to one or more embodiments, the stages may include a first transistor and a second transistor which are connected in series, the gate signal may be output from a node which is shared by the first transistor and the second transistor, and a size of an active layer of any one of the first transistor and the second transistor included in the stages corresponding to the heterogeneous structure area of the display panel may be smaller than a size of an active layer of any one of the first transistor and the second transistor included in the stages corresponding to the normal structure area of the display panel.

According to one or more embodiments, a width of the active layer of any one of the first transistor and the second transistor in each of the plurality of stages corresponding to in the heterogeneous structure area may be 80 µm or larger and 240 µm or smaller.

According to one or more embodiments, the display panel may include a driving transistor and a data routing line, the driving transistor and the data routing line may include an active layer, a first gate electrode, a second gate electrode, a source electrode, and a drain electrode, and the dummy load may include a capacitor having two or more electrodes among the active layer, the first gate electrode, the second gate electrode, the source electrode, and the drain electrode.

According to one or more embodiments, the display panel may include a first insulating layer between the active layer and the first gate electrode, a second insulating layer between the first gate electrode and the second gate electrode, and a third insulating layer between the second gate electrode and the source electrode or the drain electrode. A thickness of the first insulating layer may be larger than a thickness of the second insulating layer and the thickness of the first insulating layer may be smaller than a thickness of the third insulating layer.

According to one or more embodiments, the capacitor may include a first electrode, a second electrode, and a third electrode, the first electrode may be the active layer, the second electrode may be the first gate electrode or the second gate electrode, and the third electrode may be the source electrode or the drain electrode, and the first electrode and the third electrode may be connected to each other, or the first electrod may be the first gate electrode, the second electrode may be the second gate electrode, and the third electrode may be the source electrode or the drain electrode, and the second electrode and the third electrode may be connected to each other.

According to one or more embodiments, the active layer in the dummy load may be doped to be conductivized.

According to an embodiment of the present disclosure, the display device comprises a display area including a pixel array having a plurality of pixels connected to a plurality of gate lines, a non-display area being adjacent to the display area, the non-display area having a gate driving circuit, and a dummy load connected to an output node of the gate driving circuit to improve an erroneous output phenomenon of the gate driving circuit due to a load imbalance of the display area. Therefore, it is possible to implement the display device which suppresses an abnormal driving phenomenon due to imbalance of the load applied to the gate driving circuit and provides a uniform output characteristic.

According to one or more embodiments, the load imbalance of the display area may be caused in accordance with a change in the number of pixels connected to the gate lines, and the dummy load disposed in an area where the load imbalance is generated varies according to the change in the number of pixels.

According to one or more embodiments, the smaller the number of pixels, the larger the dummy load.

According to one or more embodiments, the dummy load may include a resistor and a capacitor, the pixel array may include a plurality of transistors each including an active layer, a gate electrode, a source electrode, and a drain electrode, and the capacitor may include a first electrode which is formed on the same layer as the active layer or the gate electrode.

According to one or more embodiments, the capacitor further may include a second electrode which is formed on the same layer as the source electrode or the drain electrode and a third electrode between the first electrode and the second electrode, and the first electrode may be connected to the second electrode or the third electrode is connected to the second electrode.

Although the embodiments of the present disclosure have been described in detail with reference to the accompanying drawings, the present disclosure is not limited thereto and may be embodied in many different forms without departing from the technical concept of the present disclosure. Therefore, the embodiments of the present disclosure are provided for illustrative purposes only but not intended to limit the technical spirit of the present disclosure. The scope of the technical spirit of the present disclosure is not limited thereto. Therefore, it should be understood that the above-described embodiments are illustrative in all aspects and do not limit the present disclosure. The protection scope of the present disclosure should be interpreted based on the following appended claims and it should be appreciated that all technical spirits included within a range equivalent thereto are included in the protection scope of the present disclosure.

What is claimed is:

1. A display device, comprising:
    a display panel including a display area having a plurality of pixels connected to a plurality of gate lines;
    a gate driving circuit in a non-display area adjacent to the display area and including a plurality of stages supplying a gate signal to the plurality of gate lines; and
    an auxiliary load connected to at least one stage of the plurality of stages in the non-display area,
    wherein a number of the plurality of pixels which are connected to at least two gate lines among the plurality of gate lines varies;
    wherein the auxiliary load includes at least two electrodes, and the at least two electrodes are overlapped with each other;
    wherein one electrode of the at least two electrodes is connected to an output node of a stage in which the auxiliary load is disposed and the gate line, and
    a constant voltage is applied to another electrode of the at least two electrodes so that the at least two electrodes form a capacitor.

2. The display device according to claim 1, wherein the auxiliary load includes the capacitor and a resistor and is located between the display area and the at least one stage among the plurality of stages or at an end of the gate line.

3. The display device according to claim 1, wherein a smaller the number of the plurality of pixels connected to the plurality of gate lines, a larger the auxiliary load.

4. The display device according to claim 1, wherein each of the plurality of stages includes a first transistor and a second transistor which are connected in series,
    the first transistor and the second transistor are connected to an output node of a stage having the first transistor and the second transistor, and
    the auxiliary load is connected to the output node and located between the output node and pixels corresponding to each of the plurality of stages, or the auxiliary load is located at an end of the gate line.

5. The display device according to claim 4, wherein a size of an active layer of any one of the first transistor and the second transistor included in the stages corresponding to a heterogeneous structure area of the display panel is smaller than a size of an active layer of any one of the first transistor and the second transistor included in the stages corresponding to a normal structure area of the display panel.

6. The display device according to claim 5, wherein a width of the active layer of any one of the first transistor and the second transistor in each of the plurality of stages corresponding to the heterogeneous structure area is 80 μm or larger and 240 μm or smaller.

7. The display device according to claim 1, wherein the plurality of stages includes emission stages which are connected to the plurality of gate lines, respectively,
    a pixel driving circuit which drives the plurality of pixels includes a driving transistor and an emitting transistor which controls emission of the plurality of pixels; and
    the emitting transistor is turned on while the plurality of pixels emits light.

8. A display device, comprising:
    a display panel including a display area having a normal structure area and a heterogeneous structure area, and a non-display area adjacent to the display area,
    wherein the display panel includes:
    gate lines;

a plurality of pixels connected to the gate lines;

a gate driving circuit having stages supplying a gate signal to the gate lines in the non-display area; and a dummy load connected to stages connected to the plurality of pixels in the heterogeneous structure area, the dummy load being in the non-display area;

wherein the stages include a first transistor and a second transistor which are connected in series, the gate signal is output from a node which is shared by the first transistor and the second transistor, and a size of an active layer of any one of the first transistor and the second transistor included in the stages corresponding to the heterogeneous structure area of the display panel is smaller than a size of an active layer of any one of the first transistor and the second transistor included in the stages corresponding to the normal structure area of the display panel.

9. The display device according to claim 8, wherein the heterogeneous structure area includes a heterogeneous structure which is not defined as a polygon, and the dummy load is adjacent to the plurality of pixels according to a shape of the heterogeneous structure.

10. The display device according to claim 8, wherein a width of the active layer of any one of the first transistor and the second transistor in each of the plurality of stages corresponding to in the heterogeneous structure area is 80 μm or larger and 240 μm or smaller.

11. The display device according to claim 8, wherein the display panel includes a driving transistor and a data routing line, the driving transistor and the data routing line include an active layer, a first gate electrode, a second gate electrode, a source electrode, and a drain electrode, and the dummy load includes a capacitor having two or more electrodes among the active layer, the first gate electrode, the second gate electrode, the source electrode, and the drain electrode.

12. The display device according to claim 11, wherein the display panel includes:

a first insulating layer between the active layer and the first gate electrode;

a second insulating layer between the first gate electrode and the second gate electrode; and a third insulating layer between the second gate electrode and the source electrode or the drain electrode, wherein a thickness of the first insulating layer is larger than a thickness of the second insulating layer and the thickness of the first insulating layer is smaller than a thickness of the third insulating layer.

13. The display device according to claim 11, wherein the capacitor includes a first electrode, a second electrode, and a third electrode, the first electrode is the active layer, the second electrode is the first gate electrode or the second gate electrode, and the third electrode is the source electrode or the drain electrode, and the first electrode and the third electrode are connected to each other, or the first electrode is the first gate electrode, the second electrode is the second gate electrode, and the third electrode is the source electrode or the drain electrode, and the second electrode and the third electrode are connected to each other.

14. The display device according to claim 11, wherein the active layer in the dummy load is doped to be conductivized.

15. A display device, comprising:

a display area including a pixel array having a plurality of pixels connected to a plurality of gate lines;

a non-display area being adjacent to the display area, the non-display area having a gate driving circuit; and a dummy load connected to an output node of the gate driving circuit to improve an erroneous output phenomenon of the gate driving circuit due to a load imbalance of the display area, wherein the dummy load includes at least two electrodes, and the at least two electrodes are overlapped with each other;

wherein one electrode of the at least two electrodes is connected to the output node of the gate driving circuit in which the dummy load is disposed and the gate line, and a constant voltage is applied to another electrode of the at least two electrodes so that the at least two electrodes form a capacitor.

16. The display device according to claim 15, wherein the load imbalance of the display area is caused in accordance with a change in a number of pixels connected to the gate lines, and the dummy load disposed in an area where the load imbalance is generated varies according to the change in the number of pixels.

17. The display device according to claim 16, wherein a smaller the number of pixels, a larger the dummy load.

18. The display device according to claim 15, wherein the dummy load includes a resistor and the capacitor, the pixel array includes a plurality of transistors each including an active layer, a gate electrode, a source electrode, and a drain electrode, and the capacitor includes a first electrode which is formed on a same layer as the active layer or the gate electrode.

19. The display device according to claim 18, wherein the capacitor further includes a second electrode which is formed on the same layer as the source electrode or the drain electrode and a third electrode between the first electrode and the second electrode, and the first electrode is connected to the second electrode or the third electrode is connected to the second electrode.

* * * * *